United States Patent [19]
Shiratsuki et al.

[11] Patent Number: 5,313,055
[45] Date of Patent: May 17, 1994

[54] TWO-DIMENSIONAL IMAGE READ/DISPLAY DEVICE

[75] Inventors: Yoshiyuki Shiratsuki; Yoshinori Yamaguchi, both of Kanagawa, Japan

[73] Assignee: Fuji Xerox Co., Ltd., Tokyo, Japan

[21] Appl. No.: 953,112

[22] Filed: Sep. 29, 1992

[30] Foreign Application Priority Data

Sep. 30, 1991 [JP] Japan .................. 3-252007
Jan. 31, 1992 [JP] Japan .................. 4-40641

[51] Int. Cl.⁵ ........................... H01J 40/14
[52] U.S. Cl. ..................... 250/208.1; 358/482
[58] Field of Search ............ 250/208.1, 216, 214 R; 358/475, 482, 483; 340/766, 781, 782

[56] References Cited

U.S. PATENT DOCUMENTS

| | | | |
|---|---|---|---|
| 4,672,219 | 6/1987 | Iwabuchi et al. | 358/482 |
| 4,695,859 | 9/1987 | Guha et al. | 358/482 |
| 4,970,381 | 11/1990 | Huang et al. | 250/208.1 |
| 5,191,219 | 3/1993 | Linke | 250/208.1 |

FOREIGN PATENT DOCUMENTS

| | | |
|---|---|---|
| 53-119619 | 10/1978 | Japan . |
| 59-122273 | 7/1984 | Japan . |
| 59-149456 | 8/1984 | Japan . |
| 62-37729 | 2/1987 | Japan . |
| 1-106467 | 4/1989 | Japan . |

Primary Examiner—David C. Nelms
Attorney, Agent, or Firm—Finnegan, Henderson Farabow, Garrett & Dunner

[57] ABSTRACT

A two-dimensional image read/display device which is able to read and display information including two-dimensional images. A two-dimenasional image read/display device comprising a substrate, an optical sensor provided on the substrate and a light emitting unit provided to the optical sensor, wherein the optical sensor comprises a sensor area and a non-sensor area arranged alternately in a two dimensional manner, the light emitting unit comprises a light emitting area and a light transmissive area arranged alternately in a two dimensional manner, and the sensor area is disposed opposed to the light transmissive area at given distance therefrom.

18 Claims, 17 Drawing Sheets

MAIN SCANNING DIRECTION

TWO-DIMENSIONAL IMAGE READ/DISPLAY DEVICE

BACKGROUND OF THE INVENTION

1. Field of the Invention

The present invention relates to an input/output device for information processing apparatus such as a computer and the like and, particularly to a two-dimensional image read/display device which is able to read and display information including two-dimensional images.

2. Description of the Related Art

In general, information processing apparatus is equipped with an image display device for displaying information. Examples of such an image display device are a CRT display device, a liquid crystal display (LCD) device, an EL display device (ELD), a plasma display device (PDP), a light emitting diode (LED) display device. In particular, recently, with the development of a high density packaging technology, there have been developed a portable personal computer including an integrated circuit (IC), onto an LCD display substrate of which an IC for driving a display is mounted, and an information processing device of a pocketbook size and the like.

Now, recently, there have been increased the number of such information processing machines and apparatus as include an image input device in addition to the above-mentioned image display device and, in view of this, there have been proposed image display devices each of which includes an image input device added thereto. For example, there has been proposed an image display device which includes a light input type of light pen added thereto in Published Unexamined Japanese Patent Application No. sho-62-37729. Besides this, there are proposed an image display device which employs a capacity coupled type of light pen, an image display device of a pen touch type using a resistance method, and other similar image display devices.

However, in the above-mentioned conventional light pen method and pen touch method, only the image that is drawn by an operator can be input and the image of an original document in which a desired image is drawn cannot be read. In view of this, there is developed a combination of a display device with an image read device which is able to read a two-dimensional image. For example, actually, there is disclosed in Published Unexamined Japanese Patent Application No. Hei-1-106467 a display device in which display elements and image read elements are formed on the same substrate. However, in this display device, because the display elements and image read elements are formed in the different areas of the same substrate, it is necessary to add an illumination device such as a light source or the like to the device, inevitably resulting in the large-sized device.

Also, the conventional image read device is, for the most part, a one-dimension contact type image sensor and, therefore, in order to read a two-dimensional image, there is required a drive system which is used to drive an original document or image sensor. This results in a large-sized image read device which is not suitable for portable information processing equipment. On the other hand, a one-dimension image sensor may be used and a sub scanning operation may be executed manually, so that a two-dimensional image can be read. In this case, a compact image read device can be realized and thus such compact image read device is suitable for a portable information processing device. However, the sub scanning operation cannot be performed due to camera movement and the like, with the result that an image cannot be read with accuracy.

Further, there have been proposed in Published Unexamined Japanese Patent Application Nos. sho-53-119619 and sho-59-149456 two-dimensional image sensors. However, such a two-dimensional image sensor requires an illumination device which is used to move a light source, resulting in a very large-scaled image sensor.

As an image input device for a facsimile and the like, there is known an elongated contact type image sensor including a large number of light receiving elements which are arranged in a line and adapted to convert information from an original document photoelectrically. This image sensor is a line type of (one dimensional) image sensor in which a large number of light receiving elements are arranged only in a line in a main scanning direction.

The above-mentioned conventional one-dimensional image sensor includes, for example, a TFT drive type of image sensor. The TFT drive type of image sensor, as shown in an equivalent circuit diagram of FIG. 1, includes a light receiving element array 51 comprising a plurality of light receiving elements 51" arranged in a line substantially equal in length to the width of an original document, a charge transfer part 52 comprising of a plurality of thin film transistors $T_{i,J}$ ($i=1-N$, $j=1-n$) respectively corresponding to the light receiving elements 51" one for one, a matrix-shaped multi-layer wiring 53, common signal lines 54 respectively guided from the multi-layer wiring 53, a driving IC 55 for sequentially reading out the potentials of the common signal lines 54, a gate pulse generation circuit 56 for applying a gate pulse VG to the charge transfer part 52, and an output line (COM) 57 for outputting in time series the potentials read by the driving IC 55.

To read a two-dimensional image by use of the above-mentioned one-dimensional image sensor, the same light receiving elements must be used repeatedly and, for this reason, the voltage of the gate pulse VG is applied to the same light receiving elements at a certain cycle to thereby read a signal. Thus, when taking into consideration the rising and falling characteristics of a current with respect to the variations in illumination intensity from the blank portion of an original document to the printed or black portion thereof or from the black portion of the original to the blank portion thereof, the speed of the image sensor to read the original is limited.

In order to solve the above problem, there have been developed the above described two-dimensional image sensors. However, as mentioned above, the two-dimensional image sensor requires an illumination device which is adapted to move a light source and, therefore, the whole image sensor provides a large-scale device which is difficult to manufacture as a commercial product. That is, it has a structure which is not suitable especially for a portable use.

Also, referring to one-dimension image sensor, there has been developed a complete contact type of image sensor with a built-in light source which is shown in FIGS. 2 and 3, aiming at realizing a compact device. The complete contact type of image sensor is constructed, as shown generally in FIG. 2, in such a manner that a light source 1 is disposed below a substrate 21 of the sensor and a roller 2 is disposed in the upper portion of the sensor.

Referring to the concrete structure of the conventional image sensor, as shown in FIG. 3 which is an explanatory view of a section in the sub-scanning direction of a sensor part thereof, a light shield layer 26 is formed on the substrate 21, the light shield layer 26 is partly taken away to thereby provide a lighting window 27 which takes in light from the back surface of the substrate 21, a light receiving element 22 is disposed on the top of the light shield layer 26, and there is provided a protection film 28 in such a manner that it can cover all these components.

Referring to the operation of the above-mentioned conventional image sensor of a complete contact type, the light from the light source 1 is allowed to enter from the back surface of the substrate 21 through a lighting window 27, the light reflecting on an original document 3 is received by the light receiving element 22, and electric charges corresponding to the amounts of the light received are read out (see Published Unexamined Japanese Patent Application No. sho-59-122273).

However, in the above-mentioned conventional image sensor of a complete contact type, as shown in FIG. 4 which is an explanatory view of a section of the sensor portion in the main scanning direction, there is a possibility that the incident light entering from a lighting window in an adjoining area may also be received by the light receiving element 22, thereby worsening the resolution of the image sensor to a great extent.

Also, in a conventional portable image input device which uses the image sensor of a complete contact type shown in FIG. 3, when reading a two-dimensional image, scanning is normally executed by hand and an image reading time is synchronized with the speed of the manual scanning. However, it has been conventionally pointed out that such manual scanning is not able to read a figure and the like with accuracy because of movement of the hands.

On the other hand, in information processing machines and apparatus, an image input/output device is widely used and a display, which is one of image output devices, includes various types of devices such as CRT, LCD, ELD and the like. As a modification for these types of displays, there has been developed a composite display which comprises a display and an input device added thereto. For example, there have been disclosed a light pen of a light input type or of a capacity coupled type (see Published Unexamined Japanese Patent Application No. sho-62-37729), a touch pen using resistance. Here, in order to confirm the two-dimensional image that is read, it is convenient if a two-dimensional image reading device and a display device are integrated into one device. However, conventionally, there has not been available an integrated device which can answer to the need that the image can be displayed on the actual spot.

SUMMARY OF THE INVENTION

The present invention aims at eliminating the drawbacks found in the above-mentioned conventional devices. Accordingly, it is an object of the invention to provide a two-dimensional image/display device which is able to display information and is able to read a two-dimensional image, and makes it possible to realize a compact image read/display device.

It is another object of the invention to provide an integrated compact two-dimensional image read/display device, and provide a method of driving the read/display device in such a manner that the resolution of a sensor can be improved by linking the display device portion of the present read/display device with the read device portion thereof in reading an image.

The above, and other objects of the present invention can be accomplished by the provision of a two-dimensional image read/display device comprising an image read means having a plurality of light receiving elements arranged two-dimensionally and a display means having a plurality of light emitting elements arranged two-dimensionally, the image read means and display means being stacked to each other, in such a manner that either the image read part or said display part provides an original document carrying surface and each of the light receiving elements is disposed at a position so as to receive light generated from each of the light emitting elements and reflected by an original document.

Further, they can be met by the provision of a two-dimenasional image read/display device comprising a substrate, an optical sensor means provided on the substrate and a light emitting means provided to the optical sensor, wherein the optical sensor means comprises a sensor area and a non-sensor area arranged alternately in a two dimensional manner, the light emitting means comprises a light emitting area and a light transmissive area arranged alternately in a two dimensional manner, and the sensor area is disposed opposed to the light transmissive area at given distance therefrom.

A method of driving a two-dimensional image read/display device comprises the steps of: allowing a plurality of light emitting elements to emit light in such a manner that the mutually adjoining light emitting elements of a display means emit no lights simultaneously; and reading electrical variations in light receiving elements of a read means corresponding to the light emitting elements that have been allowed to emit light, wherein the light emitting step is executed with respect to the light emitting elements emitting no lights, and the read step is executed with respect to the light receiving elements corresponding to the light emitting elements emitting no lights.

A method of driving an image read/display device comprises the steps of: allowing a plurality of light emitting elements to emit light in such a manner that the mutually adjoining lines of light emitting elements of a display means emit no lights simultaneously; and reading electrical variations in light receiving elements of a read means corresponding to the light emitting elements that have been allowed to emit light, wherein the light emitting step is executed with respect to the lines of light emitting elements emitting no lights, and the read step is executed with respect to the light receiving elements of a read device corresponding to the light emitting elements emitting no lights.

BRIEF DESCRIPTION OF THE DRAWINGS

The accompanying drawings, which are incorporated in and constitute a part of the specification, illustrated presently preferred embodiments of the invention and, together with the general description given above and the detailed description of the preferred embodiments given below, serve to explain the principles of the invention. In the accompanying drawings.

DESCRIPTION OF THE PREFERRED EMBODIMENTS

Description will be given hereinbelow of the preferred embodiments of the invention with reference to the accompanying drawings.

Figure 5:
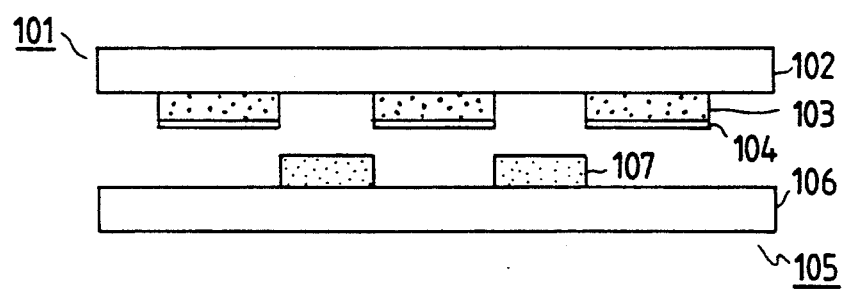
FIG. 5 is a section view of the general structure of a first embodiment of a two-dimensional image read/display device according to the invention.

In FIG. 5 showing a section view of the general structure of a first embodiment of a two-dimensional image read/display device according to the invention.

A display part 101 includes a transparent substrate 102 and a plurality of light emitting elements 103 each having a light shield film 104 thereon which are disposed on the transparent substrate 102, the light emitting elements being arranged two-dimensionally with a certain distance from one another. Also, an image read part 105 includes a substrate 106 and a plurality of light receiving elements 107 arranged two-dimensionally with a certain distance from one another. The display part 101 and image read part 105 are matched in position to each other in such a manner that each of the light receiving elements 107 is interposed between the mutually adjoining light emitting elements 103, and are then fixed to each other.

Figure 6:
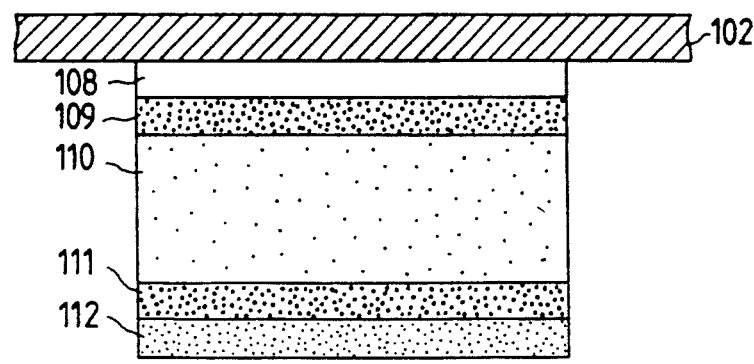
FIG. 6 is a section view of the structure of a light emitting element employed in the first embodiment.

Here, the light emitting elements 103 may be any kinds of light emitting elements such as ELs, LEDs or the like, provided that they are able to display an image and also they can be used as a light source for image reading. And the light shield film 104, of course, can be formed by applying Al, Cr or the like to the light emitting element 103 according to a vacuum evaporation method, a sputtering method or the like, while an electrode for driving the light emitting element 103 may be used also as the light shield film 104. That is, for example, when the light emitting element 103 is formed of an EL, as shown in FIG. 6, if a transparent electrode 108, an insulation layer 109, a light emitting layer 110, an insulation layer 111, and a back electrode 112 formed of Al are sequentially put on one another in this order (on the transparent substrate), then there can be formed the light emitting element 103 with the light shield film 104 thereon.

Also, the light receiving element 107 may be one which has a photoelectric conversion function. For this purpose, there can be used a photoelectric conversion element such as a photodiode formed of amorphous silicone (which is hereinafter referred to as a-Si), CdS, CdSe and the like.

Figure 7A:
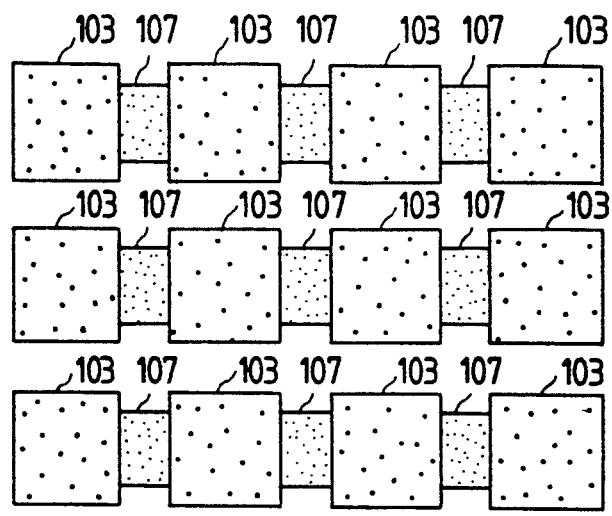
FIGS. 7A-7C are an explanatory view of the arrangement of the light emitting elements and light receiving elements employed in the first embodiment.
Figure 7B:
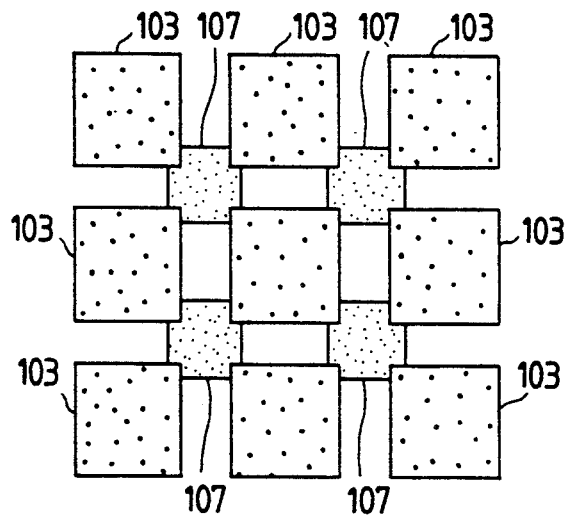
Figure 7C:
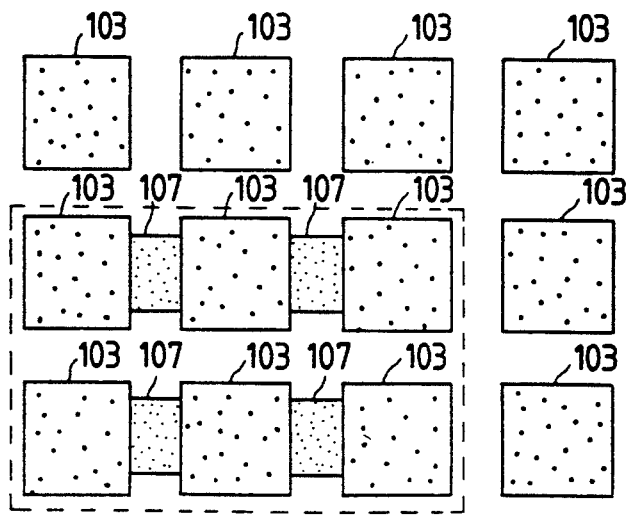

Referring now to FIG. 7 showing a plan view of a relative positional relationship between the light emitting elements 103 and light receiving elements 107, in which, as described before, each of the light receiving elements 107 is interposed between the two mutually adjoining light emitting elements. In particular, in FIG. 7A showing an embodiment in which each of the light emitting elements 103 includes 3×4 pixels and each light receiving element 107 including 3×3 pixels; in FIG. 7B, an embodiment in which each light emitting element 103 including 3×3 pixels and each light receiving element 107 including 2×2 pixels; and, in FIG. 7C, an embodiment in which each light emitting element 103 including 3×4 pixels and each light receiving element 107 including 2×2 pixels. In this manner, the image read part composed of the light receiving elements 107 is formed in the area of the display part composed of the light emitting elements 103. This can be clearly understood from the fact that the display part is used as a light source for image reading when an image is to be read. For this reason, the shape and size of the image read part can be determined arbitrarily within the area of the display part according to uses.

Next, description will be given of a method of driving the display part 101 and image read part 105. At first, when the present image read/display device is used as an image display device, similarly as in a normal ELD or the like, a display drive circuit (not shown in FIG. 5) is used to allow the respective light emitting elements 103 to emit light according to a simple matrix method or an active matrix method. Therefore, in FIG. 5, a display image can be observed from the transparent substrate 102 side.

Figure 1:
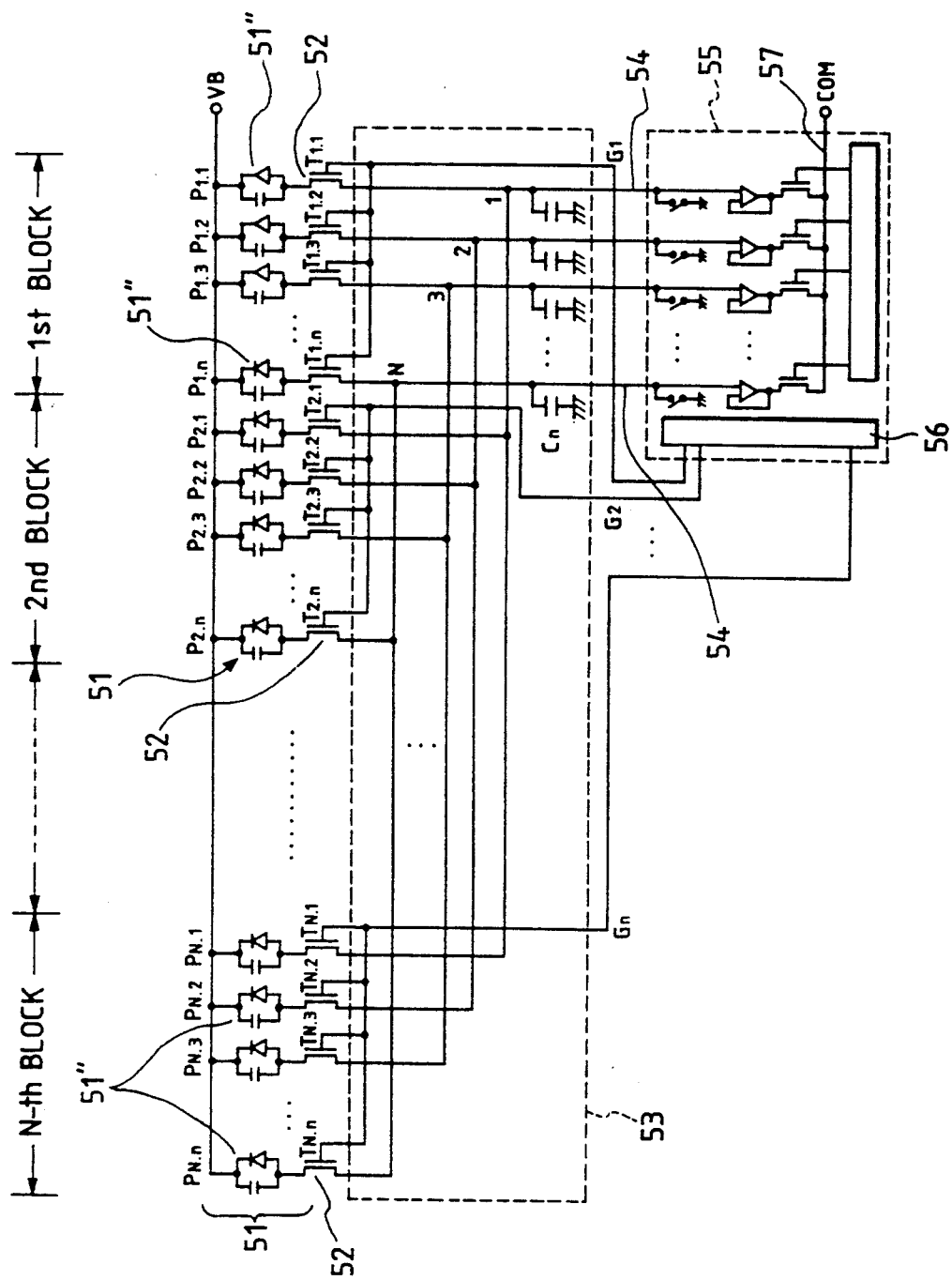
FIG. 1 is a circuit diagram of an equivalent circuit of a conventional one-dimensional image sensor.
Figure 2:
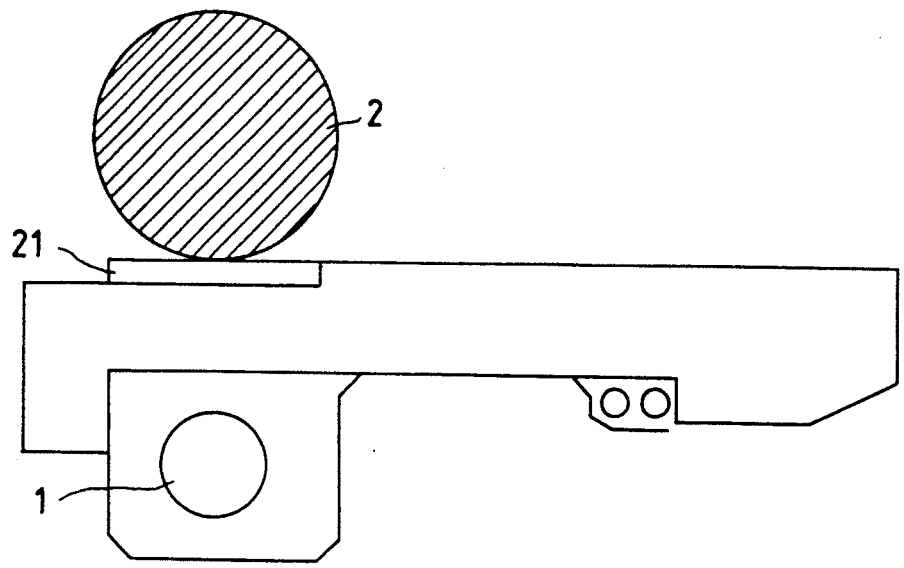
FIG. 2 is an explanatory section view of a conventional read device.
Figure 4:
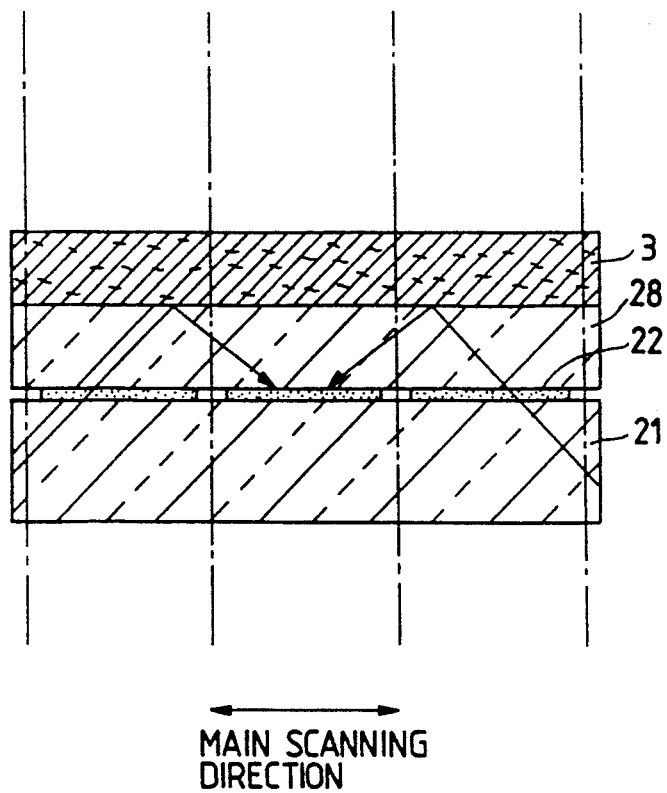
FIG. 4 is an explanatory section view of the conventional image sensor in the main scanning direction thereof.
Figure 8:
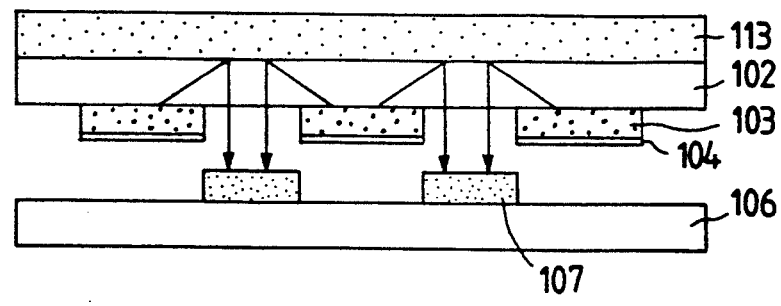
FIG. 8 is an explanatory view of the image read/display device shown in FIG. 5, showing an embodiment in which the same device is used as an image read device.

Also, when the present image read/display device is used as an image read device, as shown in FIG. 8, an original document 113 is put on the transparent substrate 102, an image read drive circuit (not shown in FIGS. 1 and 4) is used to drive the light receiving elements 107, and the display drive circuit is operated to allow the light emitting elements 103 adjoining the light receiving elements 107 to emit light simultaneously at the same brightness. For example, in the structure shown in FIG. 7A, all of the light emitting elements 103 each including 3×4 pixels are allowed to emit light and serve as light sources; in the structure shown in FIG. 7B, all of the light emitting elements 103 each including 3×3 pixels are allowed to emit light and serve as light sources; and, in FIG. 7C, only the light emitting elements 103 each including 2×3 pixels shown within broken lines are allowed to emit light and serve as light sources. And the light that is irradiated from the light emitting elements 103 and is reflected by the original document 113 passes through a light transmissive portion between the light emitting elements and enters the light receiving elements 107. Since the amount of the light entering the light receiving elements 107 varies according to the image information of the original 113, that is, the densities of the pixels, there can be obtained from the light receiving elements 107 electric signals which correspond to the densities of the respective pixels, whereby the image can be read. During this, it can be easily understood that the light shield film 104 prevents the light emitted from the light emitting elements 103 from entering the light receiving elements 107 directly, and also prevents unnecessary light from entering the light receiving elements 107 from the side portion or from the end portion thereof.

Figure 9A:
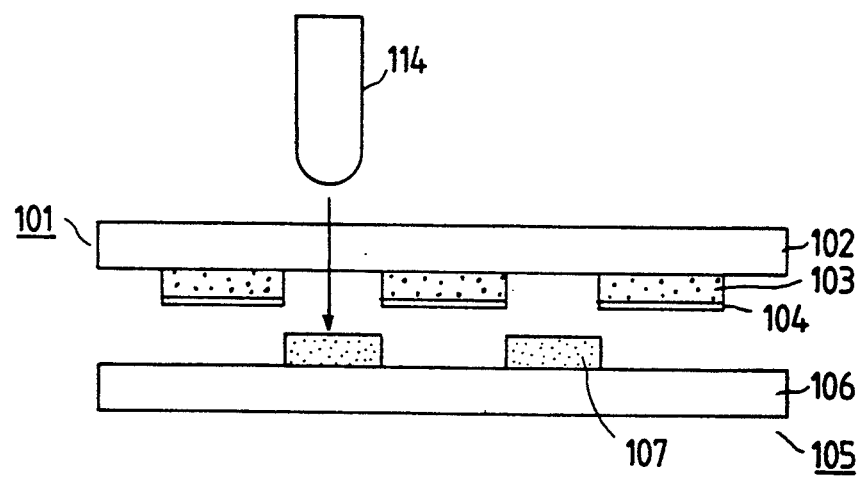
FIGS. 9A and 9B are explanatory views of another method of inputting an image.
Figure 9B:
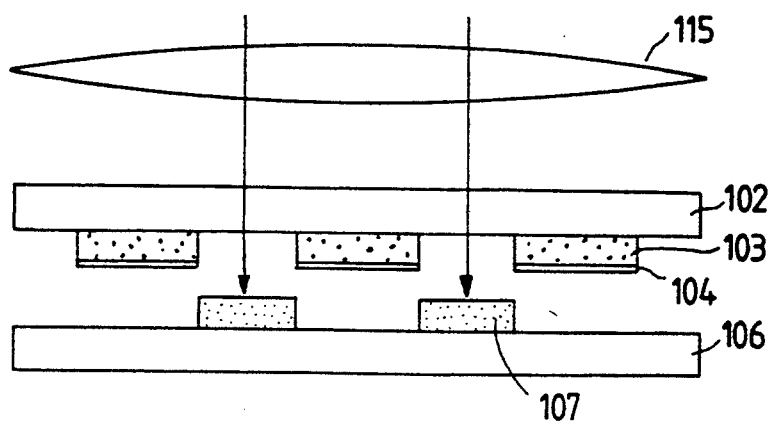

Also, in the image read/display device shown in FIG. 5, as shown in FIG. 9A, an arbitrary image can be input by allowing the light of an optical light pen 114 to enter directly the light receiving elements 107. Further, as shown in FIG. 9B, an image forming lens 115 may be disposed on the display surface side and an object image (not shown) may be formed on the light receiving elements 107 by the image forming lens 115, so that the image can be read. In either case, the light emitting elements 103 may not be allowed to emit light.

As described before, each of the light receiving elements 107 is interposed between the light emitting elements. In this arrangement, what is important is that the light receiving element 107 is disposed at a position where the light from the adjoining pixels cannot enter. In other words, if the light receiving element 107 is arranged in a manner to allow only the reflected light from an image area corresponding to the subject light receiving element 107 to enter the subject light receiving element 107, then an MTF (Modulation Transfer Function) can be improved which shows a resolution that is one of the important characteristics of a read device, while the MTF will be worsened if the reflected light from the adjoining pixels or other image areas is allowed to enter the light receiving element. In view of this, description will be given below of the best position of the light receiving element 107.

Figure 10A:
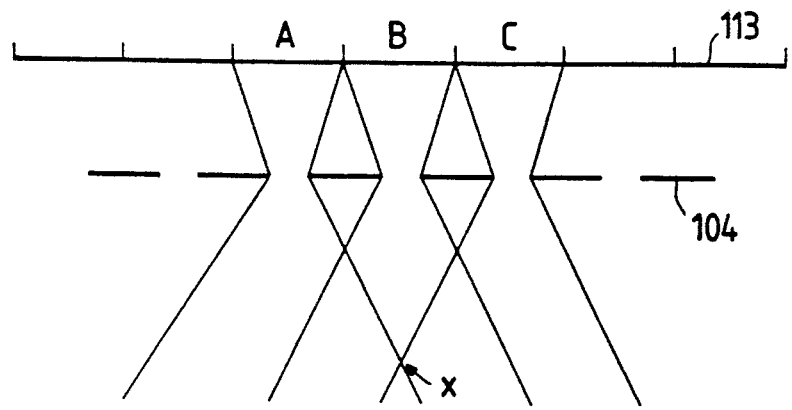
FIGS. 10A-10C are explanatory views of the best position of the light receiving elements.
Figure 10B:
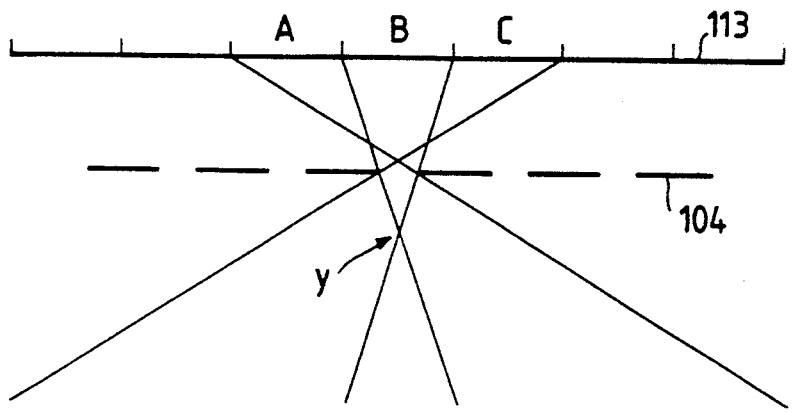

Now, as shown in FIG. 10A, taking three pixels A, B and C of the original 113 into consideration, it is considered how the reflected light from these pixels is spread through a light incident window between the light emitting elements 103. Here, in FIG. 10, for the purpose of facilitation of understanding, there are shown only the original 113 and light shield films 104.

In FIG. 10A, in an area located below a point x, the reflected lights from the pixels A and C also leak into the pixel B of the original 113 through their respective light incident windows. Also, in FIG. 10B there is shown a view of a locus of light when the reflected lights from the pixels A and C spread through a light incident window corresponding to the pixel B. In this case, it can be understood that, in an area above a point y, the lights from the pixels A and C enter an area just below the pixel B.

Figure 10C:
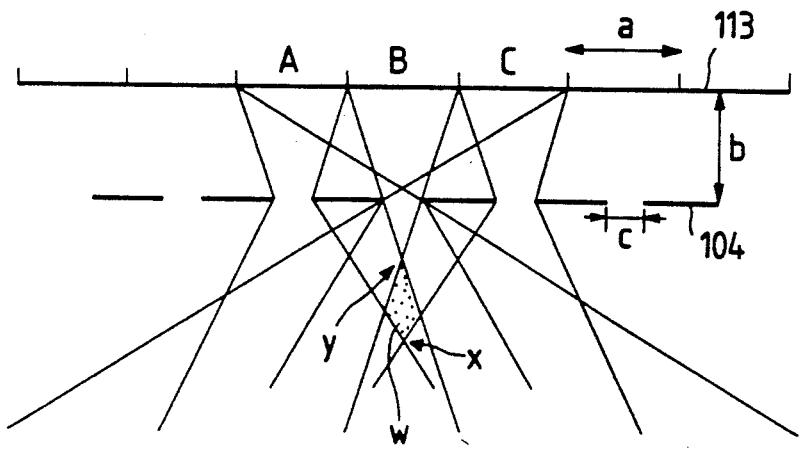

When summarizing the above matters, as shown by an area w in FIG. 10C, it can be seen that there exists an area where neither the reflected light from the pixel A nor the reflected light from the pixel C enters. And in FIG. 10C, if it is assumed that the pitch of the pixel is expressed as a, a distance from the original 113 to the light incident window is expressed as b, and the size of the light incident window is expressed as c, then a distance from the reflecting surface of the original 113 to the point, x can be expressed by ab/(a+b) and a distance from the reflecting surface of the original 113 to the point, y can be expressed by ab/(a−b). In this case, for example, if it is assumed that a pixel density is 8 dot/mm, a=125 $\mu$m, b=100 $\mu$m and c=50 $\mu$m, then the point x exists at a distance of 214 $\mu$m from the original reflecting surface, and the point y exists at a distance of 167 $\mu$m therefrom. A position, which is least affected by the influence of the incident lights from the adjoining pixels A and C in the area w in FIG. 10C, exists with a distance of 2b from the reflecting surface of the original 113 and, therefore, in this case, the position exists with a distance of 200 $\mu$m.

For this reason, if the receiving element is disposed within the area w in which the light from the pixel B is not affected by the leakage of the lights from the pixels A and C, then the MTF can be maximized. Also, if b is increased, then the MTF is lowered and, therefore, it is desired that b is minimized as much as possible. In the above-mentioned case, if the light receiving element is situated at a distance of $2b$ from the original document surface, then the MTF is equal to or greater than 30%.

In the above description, the influence of the lights reflected from the pixels A and C has been discussed but, actually, lights from other pixels further distant from the pixels A and C also leak. That is, there is no area into which lights from other pixels do not leak at all, except a case where the light incident window is extremely small. However, as the amount of light from the distant pixel area is small, the influence on the MTF by the small amount of light is small. In order to prevent perfectly the leakage of the light from the distant pixel, the light receiving element may be disposed below the point y and the thickness of the light shield film 104 may be equal to b. However, our test confirms that, if the thickness of the light shield film 104 is on the order of $b/2$, then the leakage of the lights from the other pixels can be prevented almost perfectly.

Also, with respect to the size of the light receiving element, it is most desirable that the light receiving element can be disposed within the area w not affected by the leakage of the lights from its adjoining pixels. But as the size of the light receiving element is decreased, the sensitivity thereof is lowered. For this reason, it is not always necessary to locate the light receiving element completely within the area w and the size of the light receiving element may be determined in consideration of the sensitivity within the allowable range of the MTF. However, in consideration of the distance thereof from the original document surface, the light receiving element must be interposed between the x and y points.

Further, with respect to the thickness of the light shield film 104 as well, the thickness need not always be $b/2$ or greater but it may be determined within the allowable range of the MTF. And with respect to the shape of the light shield film 104, the whole surface of the light shield film 104 need not always be thick but only a part thereof may be thick.

By disposing the light receiving element at the best position in the above-mentioned manner, the MTF can be improved when the present image read/display device is used as the image read device.

Next, description will be given below of the detailed structure of the present image read/display device. The image read/display device according to the present embodiment, as shown in FIG. 11, may be constructed by forming a display part 101 and an image read part 105 separately on separate substrates and then bonding the two parts to each other, or, as shown in FIG. 12, it may be constructed by laminating the image read part 105 and display part 101 on a single substrate.

Figure 11:
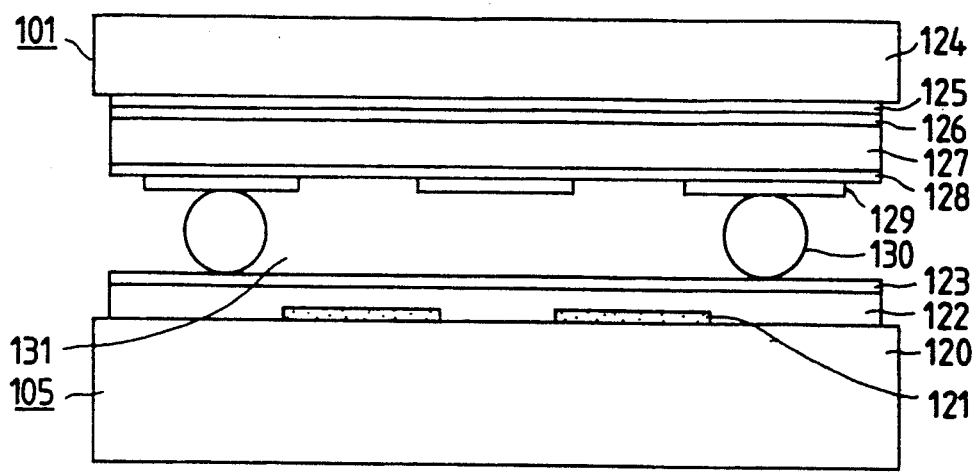
FIG. 11 is a section view of a structure obtained when the display part and image read part are respectively formed on separate substrates.
Figure 12:
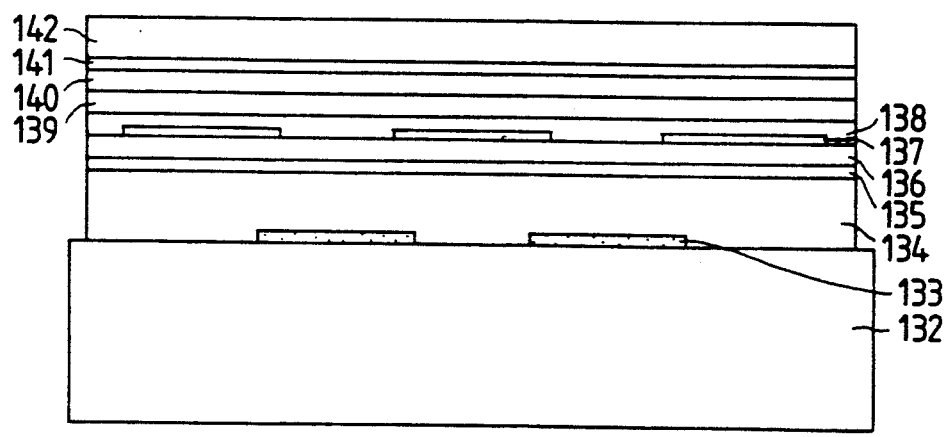
FIG. 12 is a section view of a structure obtained when the display part and image read part are put on each other on a single substrate to thereby construct the image read/display device.

In FIG. 11, the display part 101 is constructed by putting a transparent electrode 125, a dielectric layer 126, a light emitting layer 127, a dielectric layer 128, and a drive electrode 129 serving also as a light shield film sequentially on one another on a transparent substrate 124. Here, it is clear to a person skilled in the art that the respective layers can be formed with a film according to a well-known method such as a sputtering method, a vacuum evaporation method or the like.

The dielectric layers 126 and 128 are respectively used to insulate the light emitting layer 127, and each of them should be formed of a material having a high dielectric constant such as SiNx or the like so that a high intensity of electric field can be applied to the light emitting layer 127. The light emitting layer 127 may be formed of various materials. For example, when ZnS:Mn are used, then the emitting color of the light emitting layer 127 can be a yellow/orange color and, when ZnS:Tb, F are used, a green emitting color can be obtained.

The drive electrode, as described before, is formed of an opaque electrode material such as Al, Cr or the like. Also, the transparent electrode 125 and drive electrode 129 are matrix wired to each other and, therefore, the intersecting portion of the transparent electrode 125 and drive electrode 129 forms the light emitting element. The remaining layers are formed on the whole surface of the transparent substrate.

On the other hand, on a substrate 120, there are superimposed a lower electrode 121, a photoelectric conversion layer 122, and a transparent electrode 123 sequentially on one another to thereby construct the image read part 105. The lower electrode 125 and the transparent electrode 123 are matrix wired to each other and, therefore, the intersecting portion of the lower electrode 121 and transparent electrode 123 forms the light receiving element. The photoelectric conversion layer 122 is formed on the whole surface of the substrate 120. Alternatively, however, the transparent electrode 123 and photoelectric conversion layer 122 may be formed on the whole surface of the substrate and only the lower electrode 121 may be formed in a striped shape. Also, the photoelectric conversion layer may be formed in such a manner that it is separated every element. For the photoelectric conversion layer 122 there is used a-Si. By applying a-Si according to a CVD method, there can be easily formed a uniform film which has a large area.

Between the display part 101 and image read part 105, there is interposed a transparent spherical spacer 130 in order to insulate the two parts from each other and to keep a constant distance therebetween. In other words, the spherical spacers 130 having the same size are disposed on one of the substrates, transparent adhesives 131 are applied, and after then the two parts are aligned with each other in position in such a manner that the receiving element is interposed between the light shield films respectively formed of the drive electrode 129, and the two parts are uniformly pressurized, so that the two parts can be bonded to each other. It is desirable that the adhesives used here should have an index of refraction substantially equal to that of the spherical spacers 130, because this can prevent the light entering between the light shield films from being reflected irregularly between the two substrates. Also, a transparent substrate having a uniform thickness may be used in place of the spherical spacer 130. In this case, of course, as the subject transparent substrate, there should be used a transparent substrate which has an index of refraction substantially equal to that of the adhesives.

In general, the resolution of the light receiving element depends greatly on the distance between the substrates. Due to the above-mentioned structure, the distance between the substrates can be changed arbitrarily and easily by the spherical spacers 130 and also can be optimized with ease. Also, by forming the display part 101 and image read part 105 on separate substrates respectively, the yield rates of the individual parts can be improved.

Also, in FIG. 12, a lower electrode 133, a photoelectric conversion layer 134 and a transparent electrode 135 are put on one another sequentially on a substrate 32 to thereby construct the image read part. The lower electrode 133 is formed in a striped manner and is wired to the transparent electrode 135 in a matrix manner. For this reason, the transparent electrode 135 may be formed on the whole surface of the substrate and also may be formed in a striped shape and in a direction intersecting the lower electrode 133 at right angles. Also, the photoelectric conversion layer 134, similarly as in the above-mentioned case, can be formed by applying a-Si as a film according to the CVD method. And the conversion layer 134 may be formed on the whole surface of the substrate or may be formed in such a manner that it is divided every pixel.

After the image read part is constructed in the above-mentioned manner, there is formed on the transparent electrode 135 an insulation layer 136 which is used to insulate the image read part and display part from each other, and on the insulation layer 136 there are superimposed a drive electrode 137 serving also as a light shield layer, a dielectric layer 138, a light emitting layer 139, a dielectric layer 140 and a transparent electrode 141 sequentially on one another to thereby produce the display part. The materials used for the respective layers are similar to those discussed with reference to FIG. 11. Also, the drive electrode 137 is formed in a striped shape and is wired to the transparent electrode 141 in a matrix manner. For this reason, the transparent electrode 141 may be formed on the whole surface of the substrate or may be formed in a stripe shape which intersects the drive electrode 137 at right angles. The light emitting layer 139 may be formed with a film on the whole surface thereof, or may be formed in such a manner that it is divided every pixel.

Finally, a protective layer 142 is formed on the transparent electrode 141. For the protective layer 142, there may be used a transparent inorganic material or inorganic compound such as glass or the like, or a transparent organic material such as resin or the like. Of course, the light receiving element composed of the lower electrode 133 and transparent electrode 135 must be interposed between the light emitting elements each composed of the drive electrode 137 and transparent electrode 141.

By the way, it is conventionally known that, when reading an image, as a distance between the original document and light receiving element is shorter, the image can be read with higher accuracy. Therefore, it is desired that the transparent substrate 124 shown in FIG. 11 and the protective layer 142 shown in FIG. 12 may be as thin as possible.

Accordingly, as the material for the transparent substrate 124 shown in FIG. 11, there may be used a transparent sheet-shaped resin, besides the glass. For example, if PES (polyether sulfone) manufactured by Sumitomo Bakelite Co. is used, then the film thickness can be set freely up to 50 μm to 200 μm and, since its glass transition point is 223° C., the substrate formed of PES can withstand a relatively higher temperature process as well. Also, because PES is highly acid resistant and alkali resistant, it can never be deformed or solved by an etching solution or a developing solution which is used to pattern an electrode and a dielectric layer. In fact, when in FIG. 11 SiNx is used as the dielectric layers 126, 128, SiNx is normally applied as a film according to a plasma CVD method. In this process, the substrate temperature rises up to 200° C. or so but, if a heat-resisting resin such as the above-mentioned PES or the like is used, then the dielectric layers 126 and 128 can be formed with a film without being deformed. Also, the film coating of the light emitting layer 127 is normally carried out according to an EB vacuum evaporation method. In this vacuum evaporation, the temperature of the substrate rises up to 150° to 200° C. or so, the film can be coated excellently if a heat-resisting resin such as the above-mentioned PES or the like is used.

The above description can apply similarly in those shown in FIG. 12 and the above-mentioned PES can also be used for the protective layer 142. However, in the structure shown in FIG. 12, the protective layer 142 is the component that is formed finally and, therefore, the heat-resistance and the like, which are necessary in the structure shown in FIG. 11, do not require of the protective layer 142. That is, the protective layer 142 can be formed of an ordinary resin, provided that it is transparent. And, when the protective layer 142 is a sheet-shaped layer, it may be bonded to the transparent electrode 141 by means of a transparent adhesive. Also, when the protective layer 142 is liquid such as polyimide or the like, then it may be applied as a film according to a spin coating method, a roll coating method, a dip method and other similar methods.

In this manner, if the surface serving as the original document carrying surface is formed of a resin, then the protective layer can be formed with a high yield rate.

Figure 13:
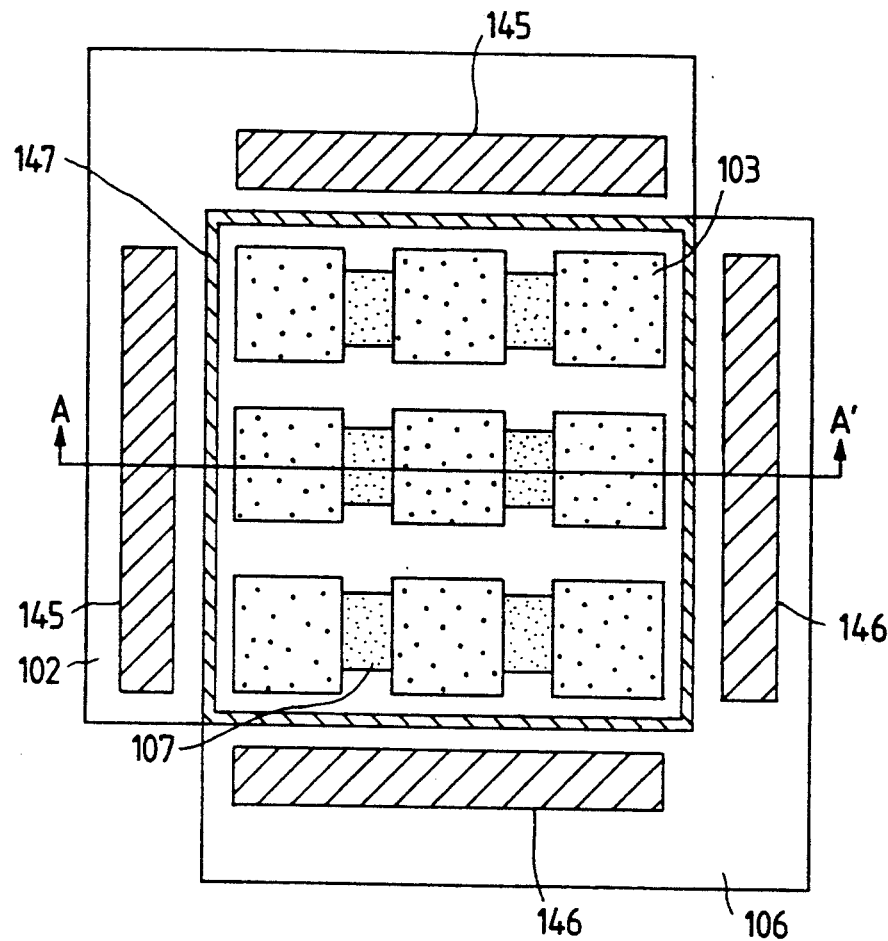
FIG. 13 is an explanatory view of connection of a light emitting element drive circuit and a light receiving element drive circuit used when the display part and image read part are formed on the separate substrates.

Next, description will be given of connection of the display part and image read part with their respective drive circuits. In FIG. 13, there is shown a plan view of the general structure of an image read/display device in which each of the light emitting elements 103 including 3×3 pixels and each of the light receiving elements 107 including 2×3. The substrate 102 of the display part 101 and the substrate 106 of the image read part 105 are shifted a given amount from each other in the longitudinal and transverse directions thereof, and the peripheries of the substrates overlapped are bonded and fixed by means of an adhesive 147. As the adhesive 147, there is used an epoxy system adhesive or a silicone system adhesive.

And, on the two sides shifted of the substrate 102 of the display part 101, there is mounted a light emitting element drive circuit 145 which is formed of ICs or other circuit elements. Similarly, on the two sides shifted of the substrate 106 of the image read part 105, there is mounted a light receiving element drive circuit 146 which is formed of ICs or other circuit elements.

Figure 14:
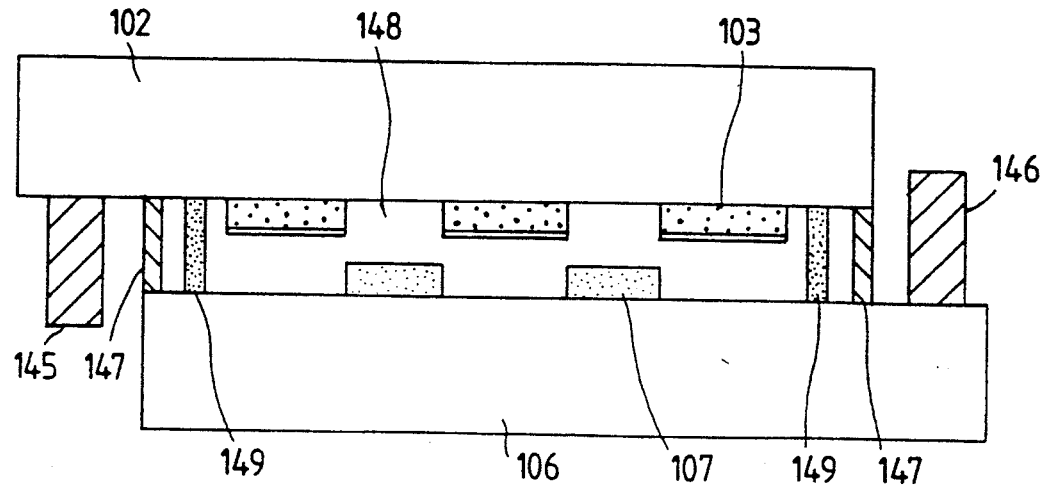
FIG. 14 is a section view taken along a line A—A' in FIG. 13.

Referring now to FIG. 14, there is shown a section view of a portion obtained by taking along the line A—A in FIG. 13, in which the display part substrate 102 and image read part substrate 106 are kept at a given distance from each other by a spacer 149 and the peripheries thereof are bonded and fixed by the adhesive 147 so as to be able to shut off air. The height of the spacer 149 is adjusted in accordance with the thickness of the display part substrate 102 and the size of a light incident window 148 in such a manner that the MTF of the optical characteristic can be increased. For example, when an element density is 8 dot/mm, that is, an element pitch is 125 μm, the thickness of the display part substrate 102 is 50 μm, and the size of the light incident window is 40 μm, then the height of the spacer 149 is about 50 μm which is substantially equal to the thickness of the display part substrate 102.

As described above, a gap between the two substrates 102 and 106 is very narrow and thus a drive IC or the like cannot be interposed between the two substrates 102 and 106. In addition, if the height of the spacer 109 is increased, then the MTF is decreased. Therefore, the gap between the two substrates cannot be widened to the extent that the drive IC can be provided. In view of these circumstances, as shown in FIGS. 9 and 10, the light emitting element drive circuit 145 and light receiving element drive circuit 146 are respectively mounted on the respective un-overlapped portions of the two mutually shifted substrates. Here, the mounting of the drive circuits 145 and 146 onto the respective substrates can be performed by means of TAB (Tape Automatic Bonding) or COG (Chip On Glass) method.

Figure 15:
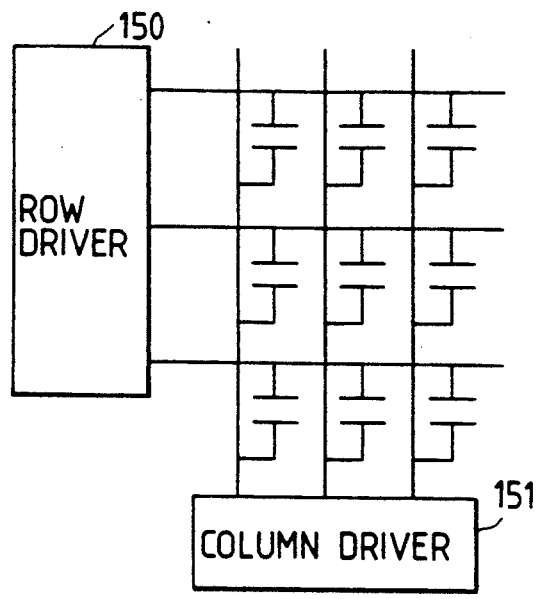
FIG. 15 is a circuit diagram of an equivalent circuit used to connect the light emitting elements to the light emitting element drive circuit.
Figure 16:
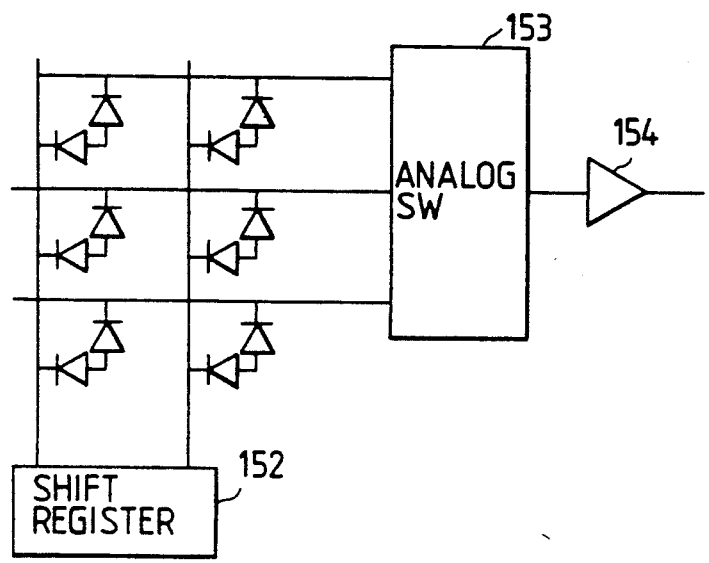
FIG. 16 is a circuit diagram of an equivalent circuit used to connect the light receiving elements to the light receiving element drive circuit.

In FIG. 15, there is shown an equivalent circuit which is used to connect the light emitting element 103 to the light emitting element drive circuit 145. The light emitting element drive circuit 145 comprises a row driver 150 and a column driver 151 which are respectively connected to row and column wires. Also, in FIG. 16, there is shown an equivalent circuit which is used to connect the light receiving element 107 to the light receiving element drive circuit 146. The light receiving element drive circuit 146 comprises a shift register 152, an analog switch 153, and a current/voltage converter 154. The shift register 152 is connected to a column wire and the analog switch 153 is connected to a row wire.

Figure 17:
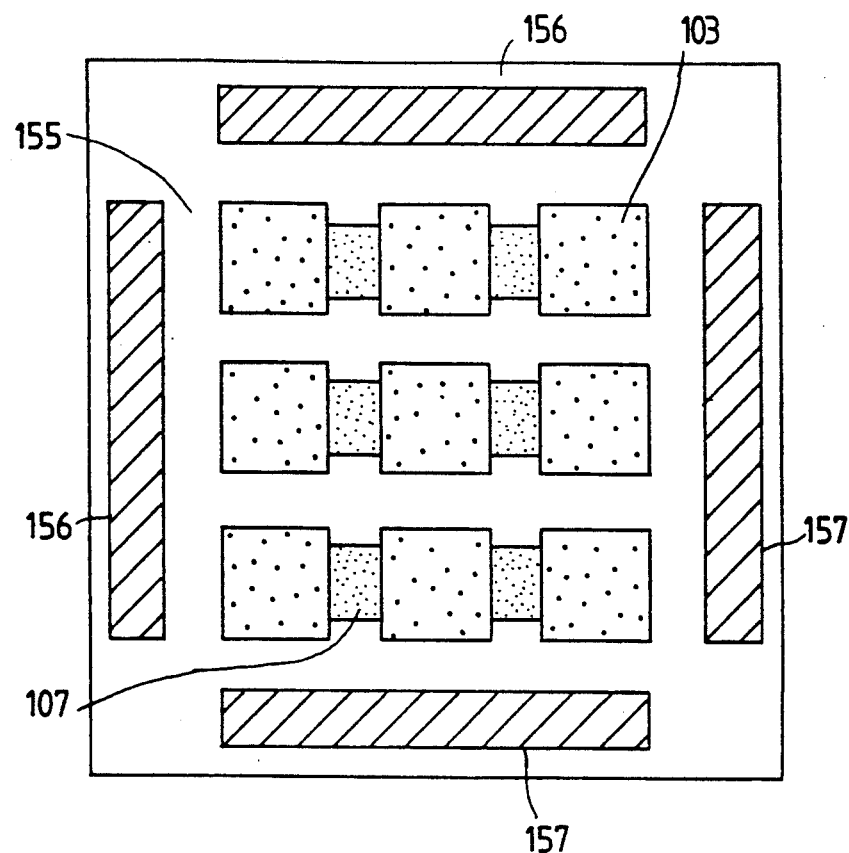
FIG. 17 is an explanatory view of connection of a light emitting element drive circuit and a light receiving element drive circuit used when the display part and image read part are put on each other on a single substrate to thereby construct the image read/display device.

In the above embodiment, the display part 101 and image read part 105 are disposed on the separate substrates, respectively. On the other hand, as shown in FIG. 12, when the image read part 105 and display part 101 are disposed superposedly on a single substrate, that is, because only one substrate is available, as shown in FIG. 17, a display element drive circuit 156 and a light receiving element drive circuit 157 are respectively disposed in the two sides of the substrate 155.

Description has been given heretofore of the first embodiment of the invention. Next, description will be given of a second embodiment of an image read/display device according to the invention. While in the first embodiment the light receiving element is interposed between the light emitting elements, in the second embodiment there is formed an opening in the light emitting element and the light receiving element is disposed at a position of the opening. The remaining details of the structure of the second embodiment are the same with those of the first embodiment.

Figure 18:
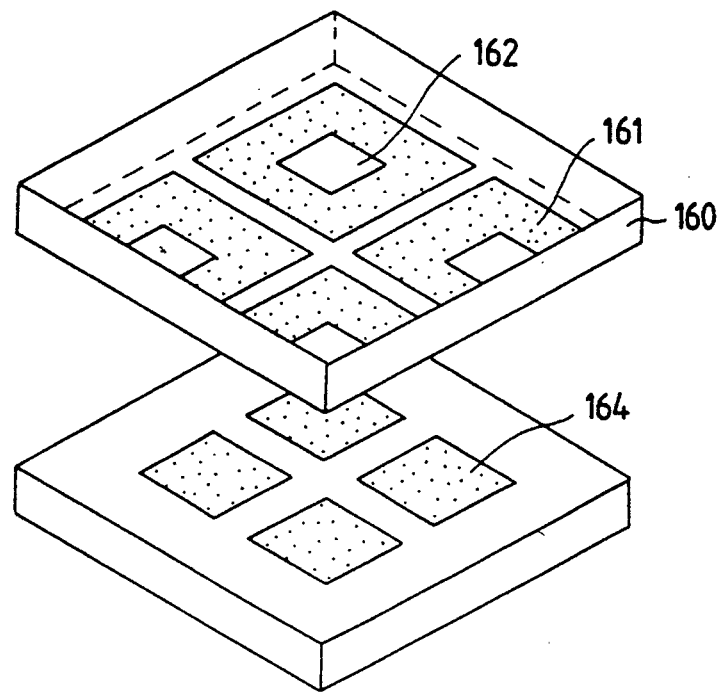
FIG. 18 is a perspective view of the structure of a second embodiment of an image read/display device according to the invention.
Figure 19:
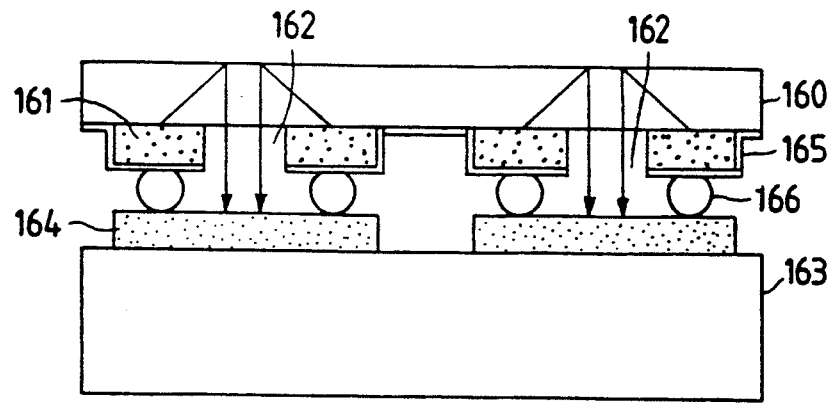
FIG. 19 is a section view of the structure shown in FIG. 18.

FIG. 18 is a perspective view which shows the structure of the second embodiment according to the invention and FIG. 19 is a section thereof. On a substrate 160, there are formed light emitting elements 161 in such a manner that they are divided from one another every pixel, and the light emitting elements 161 are arranged in a two dimensional manner on the substrate 161 to thereby construct a display part. And each of the light emitting elements 161 includes an opening 162 formed in the central portion thereof, while the other portions of the light emitting element other than the opening 162, as shown in FIG. 19, are coated with a light shield film 165 so as to prevent entrance of unnecessary light from the other places than the original document surface. Also, on a substrate 163, there are formed light receiving elements 164 such that they are divided from one another every pixel, and the light receiving elements 164 are arranged in a two dimensional manner to thereby construct an image read part. And the substrates 160 and 163 are adjusted in position to each other in such a manner that each of the light receiving elements 164 is situated just below the opening 162 of the light emitting element 161, and are then bonded to each other by means of an adhesive. In FIG. 19, reference numeral 166 designates a spacer.

It is quite natural that in the present structure the display surface serves as an original document carrying surface and, for this reason, as shown in FIG. 19, the light irradiated from the light emitting element 161 and reflected by the original document surface is allowed to enter the light receiving element 164 through the opening 162, so that the reflected light from the original document surface can be made to enter the light receiving element 164 with high efficiency.

Figure 20:
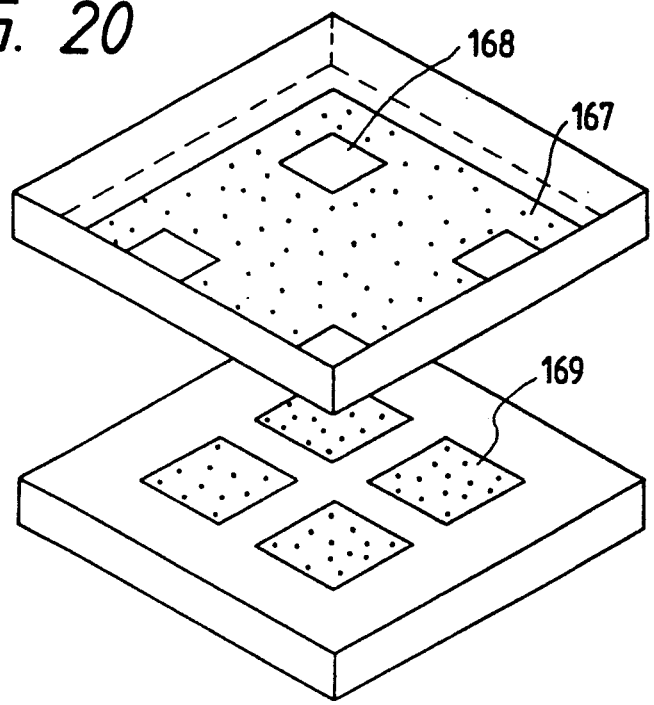
FIG. 20 is a perspective view of a modification of the second embodiment.

In FIGS. 18 and 19, a single opening 162 is formed in the light emitting element 161 but, alternatively, a plurality of openings may be formed and there is shown in FIG. 20 the structure of the alternative embodiment. In FIG. 20, four openings 168 are formed in one light emitting element 167 and one light receiving element 169 is disposed in each of the openings 168. This structure is significant: in general to read an image there is required a resolution of the order of 400 SPI, while to display an image there suffices a resolution of the order of 200 SPI; therefore, for example, if the light receiving element is formed such that a resolution of 400 SPI can be obtained and the light emitting element is formed such that a resolution of 200 SPI, one half of the resolution of the light receiving element, then there can be obtained a structure which can satisfy both of the resolutions necessary for the image display and image reading; and, if both of the light emitting and receiving elements are to be formed such that a resolution of 400 SPI can be obtained, then a very great load will be applied to the packaging of the light emitting elements, light receiving elements and the drive circuits therefor, but if the structure shown in FIG. 20 is employed, then an image read/display device can be manufactured with a good yield rate.

Now, in FIGS. 18 and 20, the display part and image read part are firstly formed on the separate substrates and are then bonded together but, alternatively, similarly as in FIG. 12, the image read part and display part may be laminated on a single substrate to thereby construct an image read/display device.

Next, description will be given below of a third embodiment of an image read/display device according to the invention.

While in the above-mentioned first and second embodiments the original document carrying surface in reading an image is identical with the display surface, in the third embodiment, a display surface and an original document carrying surface are provided such that they are different from each other, and the remaining portions of the structure are the same as in the first embodiment. The structure of the third embodiment is shown in FIG. 21.

Figure 21:
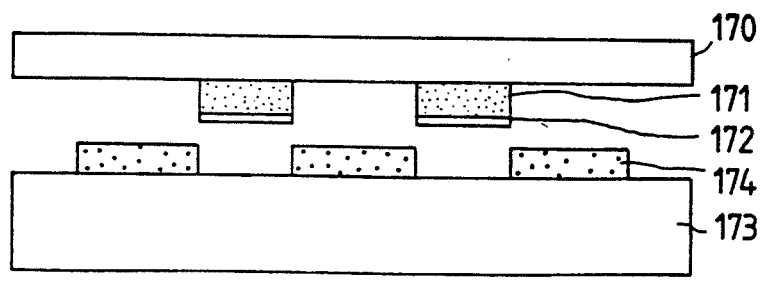
FIG. 21 is a section view of the structure of a third embodiment of an image read/display device according to the invention.

In FIG. 21, there is shown a section view of the general structure of the third embodiment of an image read/display device according to the invention, in which a plurality of light receiving elements 171 each with a light shield film 172 are formed on a transparent substrate 170 at a given distance from one another in a two-dimensional manner to thereby construct a display part, and a plurality of light emitting elements 174 are formed on a transparent substrate 173 at a given distance from one another to thereby construct an image read part 105. And the display part and image read part are adjusted in position in such a manner that the light receiving element 171 is interposed between the light emitting elements, and are then fixed to each other.

Figure 22:
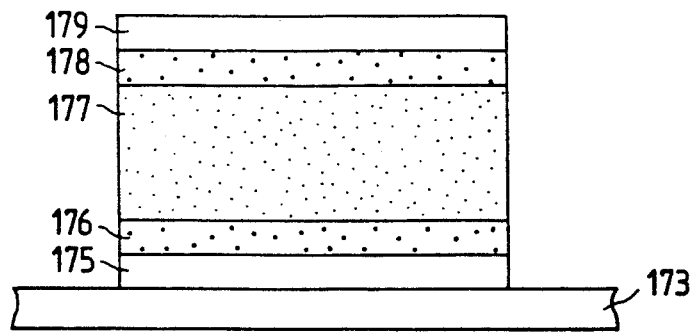
FIG. 22 is a section view of the structure of the light emitting element employed in the third embodiment.

Here, as will be described later, the light emitting element 174 must be arranged such that the two surfaces thereof are able to emit light to the transparent substrate 173 side and the image read part side, respectively. For this reason, as shown in FIG. 22, a transparent electrode 175, a first insulation layer 76, a light emitting layer 77, a second insulation layer 178 and a transparent electrode 179 are put on one another sequentially in this order on the transparent substrate 173 to thereby construct the image read part. Also, for the light emitting element 171, there can be used a photodiode formed of a-Si, or a photoelectric conversion element such as CdS, CdSe and the like. In this case, if the drive electrode on the display part side is formed of a transparent metal such as Al, Cr or the like, then the drive electrode is allowed to serve also as the light shield film 172.

In this structure, when the present image read/display device is used as an image display device, the respective light emitting elements 174 are allowed to emit light by means of a display drive circuit (not shown in FIG. 21) according to a simple matrix method or an active matrix method. Thanks to this, in FIG. 21, a display image can be observed from the transparent substrate 173 side.

Figure 23:
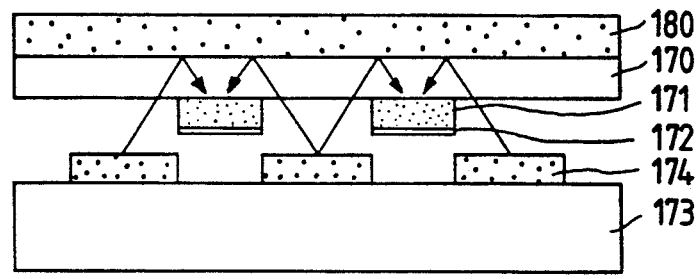
FIG. 23 is an explanatory view of an embodiment in which the image read/display device shown in FIG. 21 is used as an image read device.

On the other hand, when the present image read/display device is used as an image read device, as shown in FIG. 23, an original document 180 is put on the transparent substrate 170 and the light receiving elements 171 are driven by means of an image read drive circuit (not shown), and at the same time a display drive circuit is used to drive the light emitting elements adjoining the light receiving elements 171 to emit light simultaneously at the same brightness. This enables the lights irradiated from the light emitting elements 174, as shown by arrows in FIG. 23, to be reflected by the original document 180 and enter the light receiving elements 171. In this image reading, it is obvious that the light shield film 172 prevents the light emitted from the light emitting element 174 from entering the light receiving element 171 directly.

Figure 24:
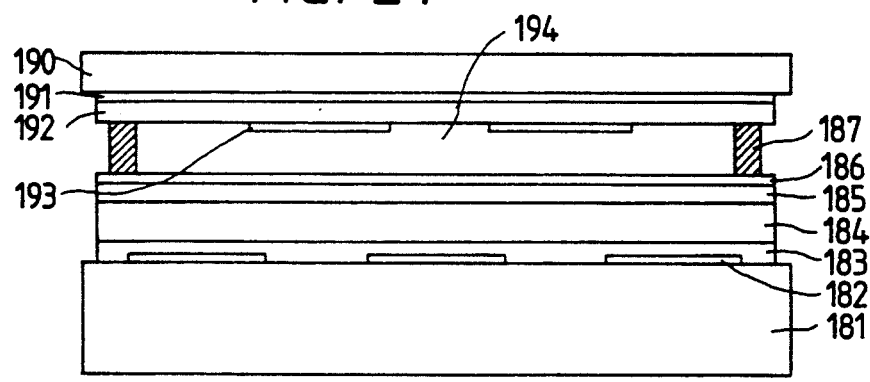
FIG. 24 is a section view of a structure obtained when the display part and image read part are respectively formed on separate substrates.
Figure 25:
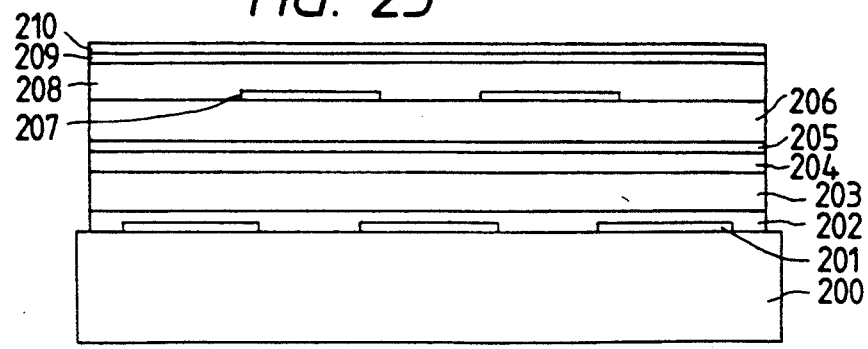
FIG. 25 is a section view of a structure obtained when the display part and image read part are laminated on a single substrate to thereby construct the third embodiment.

Alternatively, the image read/display device illustrated in the present embodiment, as shown in FIG. 24, can be constructed by forming the display part and image read part separately on separate substrates and then bonding them to each other, or, as shown in FIG. 25, can be constructed by laminating the display part and image read part on a single substrate.

In FIG. 24, the display part is constructed by putting a transparent electrode 182, a dielectric layer 183, a light emitting layer 184, a dielectric layer 185 and a transparent electrode 186 sequentially in this order on a transparent substrate 181. The materials used for the dielectric layers 183, 185 and light emitting layer 184 are similar to those discussed in the above-mentioned first embodiment. Also, the fact that the transparent electrodes 182 and 185 are wired in matrix manner is the same as in the first embodiment and, for this reason, a portion at which the transparent electrode 182 intersects the transparent electrode 185 provides the light receiving element.

On the other hand, the image read part is constructed by putting a transparent electrode 191, a photoelectric conversion layer 192 and a drive electrode 193 serving also as a light shield film sequentially in this order on a transparent substrate 190. The transparent electrode 191 is wired to the drive electrode 193 in a matrix manner and, therefore, a portion at which the transparent electrode 191 intersects the drive electrode 93 provides the light receiving element. The drive electrode 93 is formed of an opaque metal such as Al, Cr or the like.

And between the display part and image read part, there is interposed a transparent spacer 187 which is used to insulate the two parts from each other and also to keep the two parts at a given distance from each other. The two above substrates are bonded to each other by means of a transparent adhesive disposed in a space which is designated by 194 in FIG. 24.

Also, in FIG. 25, at first, a transparent electrode 201, a dielectric layer 202, a light emitting layer 203, a dielectric layer 204 and a transparent electrode 205 are sequentially put on a transparent substrate 200 to thereby produce a display part. Of course, the transparent electrode 201 is wired to the transparent electrode 205 in a matrix manner. Also, the light emitting layer 203 may be formed on the whole surface of the transparent substrate or may be formed in such a manner that it is divided every pixel.

After the display part is constructed in this manner, there is formed on the transparent electrode 205 an insulation layer 206 which is used to insulate the display part and image read part from each other. Then, a drive electrode 207 which is used also as a light shield layer, a photoelectric conversion layer 208 and a transparent electrode 209 are sequentially put on the insulation layer 206 to thereby construct an image read part. In this case, the materials which are used for the respective layers are similar to those previously discussed in the first embodiment. Similarly, the drive electrode 207 is wired to the transparent electrode 209 in a matrix manner, and the photoelectric conversion layer 208 may be formed in a film on the whole surface of the substrate or may be formed in such a manner that it is formed divided every pixel.

Finally, a protective layer 210 is formed on the transparent electrode 209. Also, of course, each of the light receiving elements is interposed between the light emitting elements.

Although description has been given heretofore of the embodiments of the invention, the invention is not limited to these embodiments but various changes and modifications are possible. For example, by multi-coloring the light emitting elements, there can be realized a color image sensor/color display. In other words, in the case of EL elements, by changing the light emitting materials, colors R (red), G (green) and B (blue) lights can be emitted. In addition, since the materials are all transparent, if the materials are put on one another, then a color display can be constructed with ease and, by employing this color display as a light source, a color image sensor can be realized.

Figure 3:
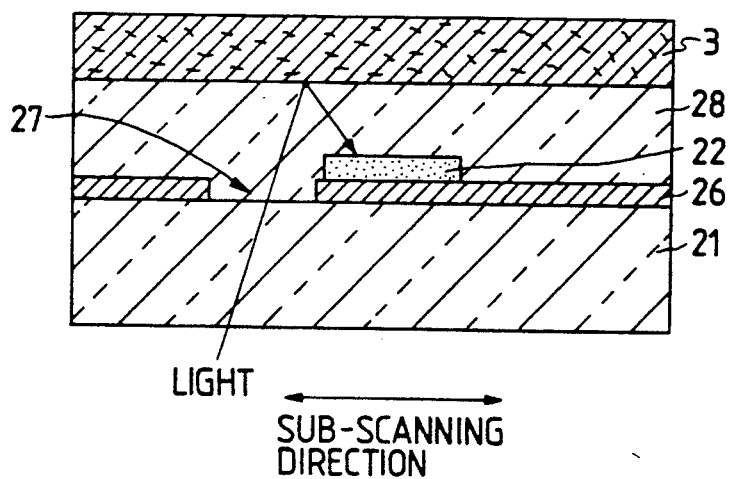
FIG. 3 is an explanatory section view of the conventional image sensor in the sub-scanning direction thereof.
Figure 26:
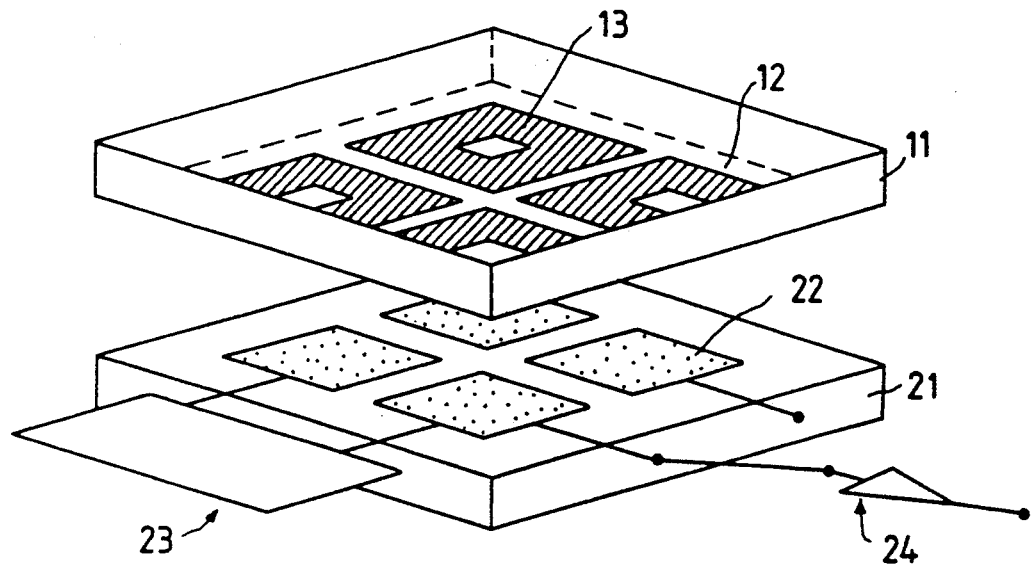
FIG. 26 is a perspective view of an embodiment of a read/display device according to the invention.
Figure 27:
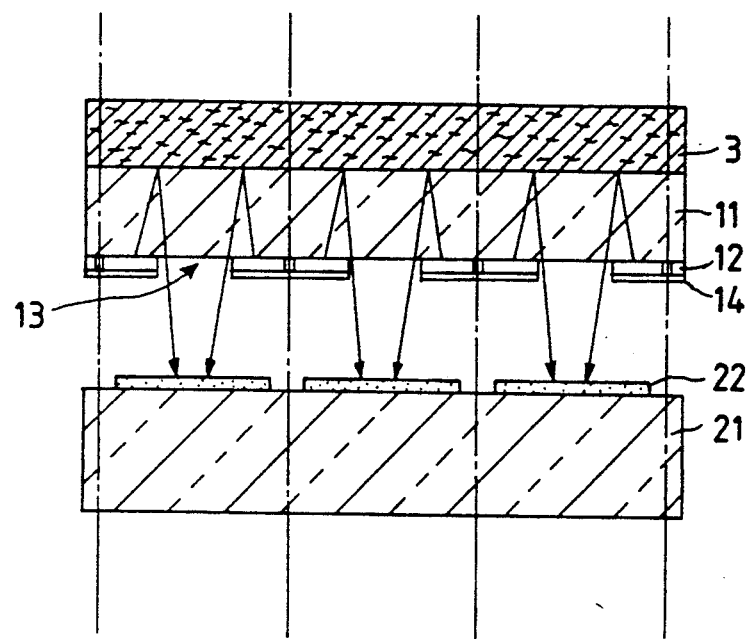
FIG. 27 is an explanatory section view of the above embodiment, showing the reading state thereof.

FIG. 26 is a schematic perspective view of a read/display device according to a fourth embodiment of the invention, and FIG. 27 is an explanatory section view of the read/display device according to the fourth embodiment. In this embodiment, components which are similar in structure to the conventional image sensor shown in FIG. 3 are given the same reference characters.

In the read/display device of FIG. 26, the panel of the display device is arranged opposed to the panel of the read device and the light emitting elements of the display device are arranged to correspond to the light receiving elements of the read device one for one.

The display device comprises a transparent substrate 11 such as glass and a plurality of display elements 12 arranged spaced from one another on the substrate 11 in a two dimensional direction, while the display element 12 serves also as the light source of a light receiving element 22 included in the read device. In the present embodiment, an EL light emitting element which is a self-light-emitting element is used as the display element 12. Although not shown in the figure, electrodes used to drive the EL light emitting elements are wired in a matrix manner and to the terminal ends of the electrodes are connected drivers in row and column directions. This allows an arbitrary display element 12 to emit light.

Also, in order that the reflected light from an original document 3 can reach the light receiving element 22, there is provided a lighting window 13 in the central portion of the display element 12. All components, except for the lighting window 13, as shown in FIG. 27, are covered with a light shield layer 14, in order to prevent the light from the display element 12 from irradiating the light receiving element 22 directly.

Now, in the read device, the light receiving elements 22 are respectively provided separately from one another, one light receiving element for one pixel, and the display element 12 of one pixel and the light receiving element 22 of one pixel are arranged so as to be opposed to each other. To the light receiving element 22, there are connected a shift register 23 used to apply a pulse and a Q-V converter 24 used to convert variations in the amount of electric charges generated within the light receiving element 22 into electric signals.

Figure 28:
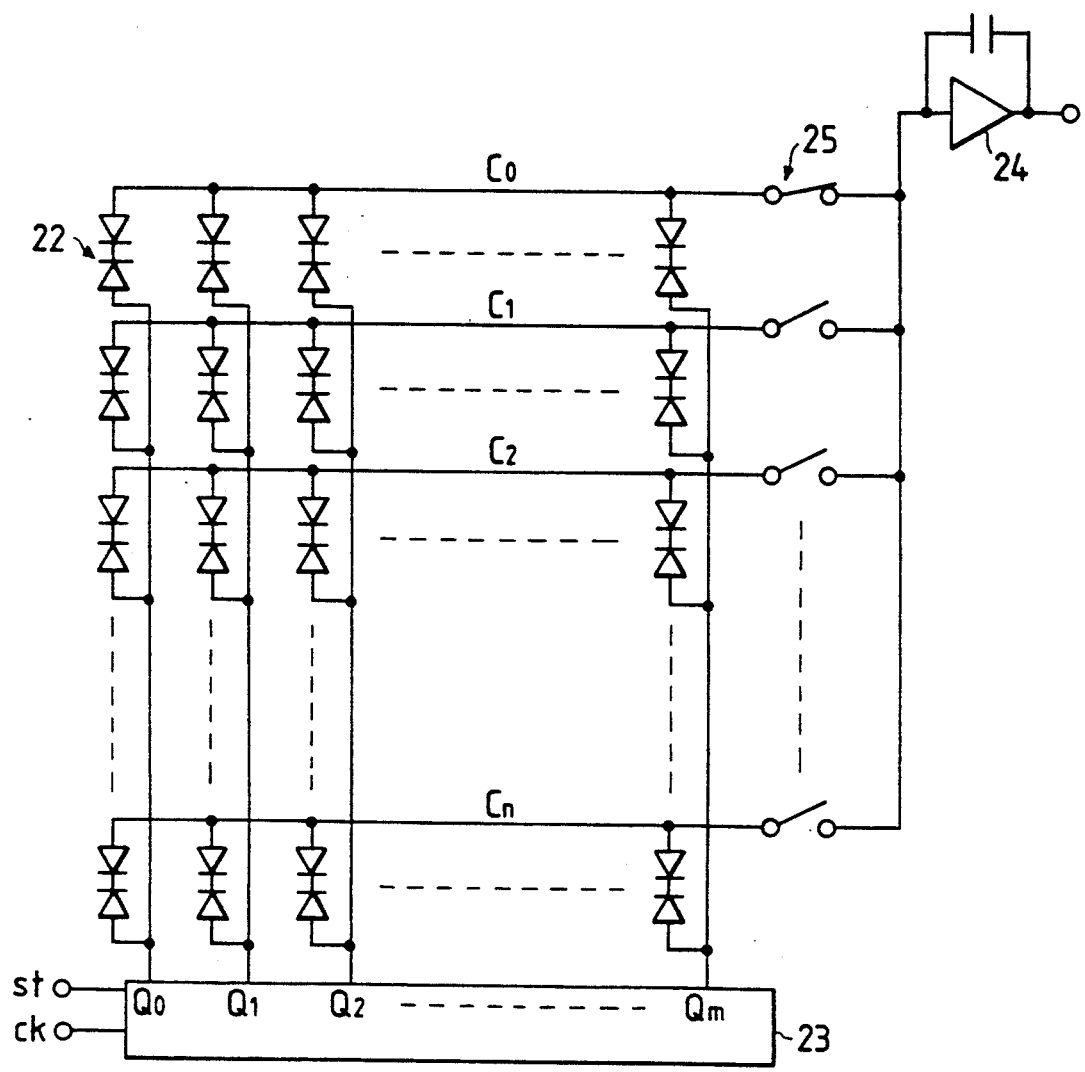
FIG. 28 is a circuit diagram of an equivalent circuit employed in the read device according to the embodiment.

Referring now to FIG. 28, there is shown a circuit diagram of an equivalent circuit which is used to drive the light receiving elements arranged two-dimensionally in the read device portion of the read/display device according to the present embodiment of the invention. One light receiving element is composed of two photodiodes which are connected to each other with the polarities thereof reversed to each other.

Referring to an image reading operation to be performed in the read/display device according to the present embodiment, the light receiving elements 22 are divided by common electrodes C0–Cn into groups. By switching these groups by use of an analog switch 25, signals from the light receiving elements 22 are transferred in each of the common electrodes C0–Cn (that is, every line) to the Q-V converter 24 and, by sequentially applying reset pulses every light receiving element from the shift register, image signals in a line are read out.

Now, description will be given of a method of reading an image in the read/display device according to the present embodiment (that is, a method of driving the read/display device) by use of a timing chart shown in FIG. 29. If a clock (ck) and a start pulse (st) are input to the shift register 23, then pulses are output in time series from the outputs Q0–Qm of the shift register 23. In particular, responsive to the start pulse (st) and at the time of rising of the clock (ck), the pulses from the output Q are output in time series. When the first output of the pulses from the outputs Q0–Qm is completed, then a start pulse (st) is given again so that the next pulses are output from the outputs Q0–Qm.

The reset pulses output from the outputs Q0–Qm cause the light receiving elements connected to the common electrodes C0–Cn to be reset to their initial states every the same line. In this case, the line of light receiving elements to be reset can be connected to the Q-V converter 24 by turning on the analog switch 25 provided on the associated common electrode. In this manner, the light receiving elements to be reset can be reset every line.

Here, due to the fact that each of the light receiving elements is composed of two photodiodes with the cathodes thereof connected to each other, a state of the light receiving element being reset is a state in which electric charges in a capacity provided in the light receiving element. And, if light is irradiated onto the light receiving element, then there are generated electric charges according to the amount of the light which offset the charged electric charges. Further, in this state, if a reset pulse is given again, then electric charges are charged in order to supplement the offset electric charges. At that time, if the supplemented electric charges are output to the Q-V converter 24, then the image signal can be read.

In particular, description will be given below of a method of reading out the image signals of the light receiving elements 22 respectively connected to the common electrode C0 with reference to a timing chart shown in FIG. 29. The timing chart shown in FIG. 28 relates to a case in which the display elements 12 are allowed to emit light independently. At first, the analog switch 25 is turned on to thereby connect the common electrode C0 to the Q-V converter 24 and all of the light receiving elements 22 connected to the common electrode C0 are initialized by a reset pulse. During this operation, other common electrodes C1–Cn are left released by turning off the associated analog switches 25.

Then, while a line of display elements respectively disposed opposed to the light receiving elements 22 connected to the common electrode C0 is expressed as EL0, out of independent display elements el, 00, el 01, . . . , el 02m−1, el 02m, display elements of even bits el 00, el 02, . . . , el 02m−2, el 02m are allowed to emit light for a given period of time and are connected to the common electrode C0, so that electric charges serving as image signals are generated and stored in the light receiving elements 22 respectively disposed opposed to the display elements 12 of even bits in the display elements line EL0. The light emitting period of the display elements 12 of even bits provides the electric charges storage time of the light receiving elements 22.

Next, a reset pulse is applied again to thereby supplement electric charges to the light receiving elements 22 connected to the common electrode C0 according to the amount of internal electric charges previously generated in the light receiving elements 22, so that the light receiving elements 22 are initialized again. The supplemented electric charges are converted into electric signals by the Q-V converter 24 and the image signals are read out. That is, the amount of electric charges supplemented to the light receiving elements 22 respectively opposed to the display elements 12 of even bits are read out as signals.

Figure 29:
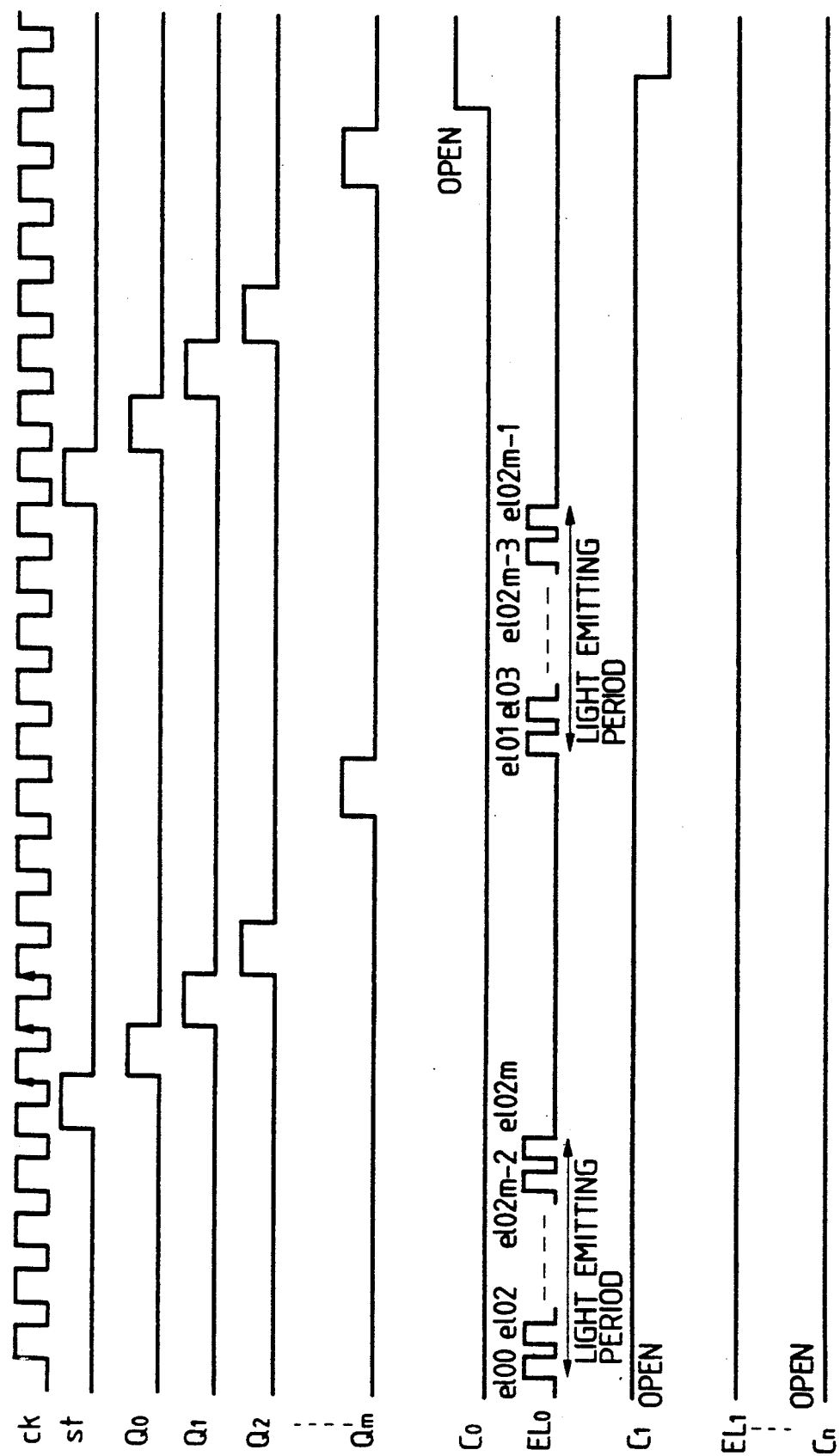
FIG. 29 is a timing chart of the embodiment.

And these even bit data are once stored in an FIFO memory shown in FIG. 29 which is a block diagram of the FIFO memory. As shown in FIG. 29, the FIFO memory includes a timing generator 30, an A/D converter 31 which performs an analog/digital (A/D) conversion in accordance with a clock (ADCK) from the timing generator 30, and an even memory 32 and an odd memory 33 each of which stores the output of the A/D converter 31 in synchronization with the timing generator 30. The even bit data are once stored in the even memory 32.

Next, the display elements of odd bits el 01, el 03, . . ., el 02m−3, el 02m−1, out of the display elements of the display element line EL0 respectively opposed to the light receiving elements 22 connected to the common electrode C0, are allowed to emit light for a given period of time, thereby storing electric charges in the light receiving elements 22 opposed to the display elements 12 of even bits. If a reset pulse is applied again, then electric charges are supplemented to the light emitting elements 22 opposed to the display elements 12 of odd bits according to the amount of internal electric charges previously generated in the light emitting elements 22, so that the same light emitting elements 22 are initialized again. The supplemented electric charges are converted into electrical signals by the Q-V converter 24, and the image signals are read out and are once stored in the FIFO memory shown in FIG. 30. In this case, the odd bit data are stored in the odd memory 33 of the FIFO memory shown in FIG. 30.

By setting the FIFO memory, the input data can be read out alternately one even bit after one odd bit and thus the image data can be read out sequentially from the image data of an initial bit to the image data of a final bit.

After completion of application of the reset pulse, the analog switch 25 is turned off to thereby release the common electrode C0. Similarly, with respect to the remaining common electrodes C1-Cn as well, the image data are read out in the above-mentioned manner, so that the image information of a two dimension can be read out.

According to the method of driving a read/display device shown in FIG. 29, the display elements 12 of the display device are arranged to emit light every other bit, whereby it is possible to greatly reduce the leakage of the light from the adjoining bits to the corresponding light receiving elements and thus the resolution of the sensor can be remarkably improved. However, although in the method of driving a read/display device according to the embodiment shown in FIG. 29, the EL elements are allowed to emit light every other bit, this is not limitative but the EL elements may be allowed to emit every two or more bits.

Figure 30:
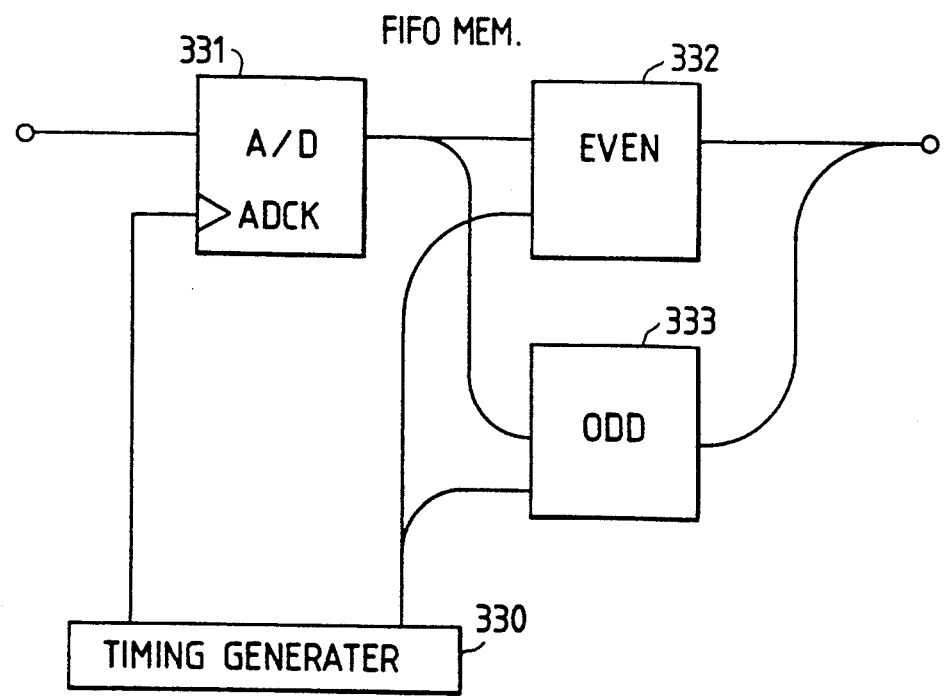
FIG. 30 is a block diagram of the structure of a FIFO memory employed in the embodiment.

Next, in the read/display device according to the present embodiment, description will be given below of a method of reading out an image signal by allowing the display elements 12 of the display device to emit light every line by use of a timing chart shown in FIG. 30.

By means of the outputs Q0-Qm of the shift register 23, a reset pulse is applied to the light receiving elements 22 to thereby initialize the light receiving elements 22 of all bits. And the light emitting elements lines EL are allowed to emit light every line; for example, the even lines EL0, EL2, . . . , EL2n of light emitting elements are allowed to emit light, and electric charges are stored in the corresponding lines of light receiving elements. That is, the electric charges are stored in the even lines of light receiving elements.

Again, a reset pulse is applied to thereby supplement electric charges according to the amount of internal electric charges generated in the light receiving elements 22, the supplemented electric charges are converted into electrical signals by the Q-V converter 24, and the data of the even lines are once stored sequentially in the even memory 32 of the FIFO memory.

Next, the odd lines EL1, EL3, . . . , EL2n−1 of light emitting elements are allowed to emit light and electric charges are stored in the corresponding lines of light receiving elements. That is, the electric charges are stored in the odd lines of light receiving elements. Similarly to the even lines of light receiving elements, a reset pulse is again applied to thereby supplement electric charges, the supplemented electric charges are converted into electrical signals by the Q-V converter 24, and the data of the odd lines are once stored sequentially in the odd memory 33 of the FIFO memory.

And read-out of the data from the FIFO memory is executed in the order of the common electrodes C0, C1, . . . , C2n−1, C2n of the light receiving elements. In other words, at first, the data of the light receiving elements line corresponding to the light emitting elements line EL0 are output from the even memory 32 of the FIFO memory, and next the data of the light receiving elements line corresponding to the light emitting elements line EL1 are output from the odd memory 33 of the FIFO memory. In this manner, by outputting the data of the light receiving elements lines alternately from the even memory 32 and odd memory 33, the image data are output in the order of the common electrodes of the light receiving elements.

Figure 31:
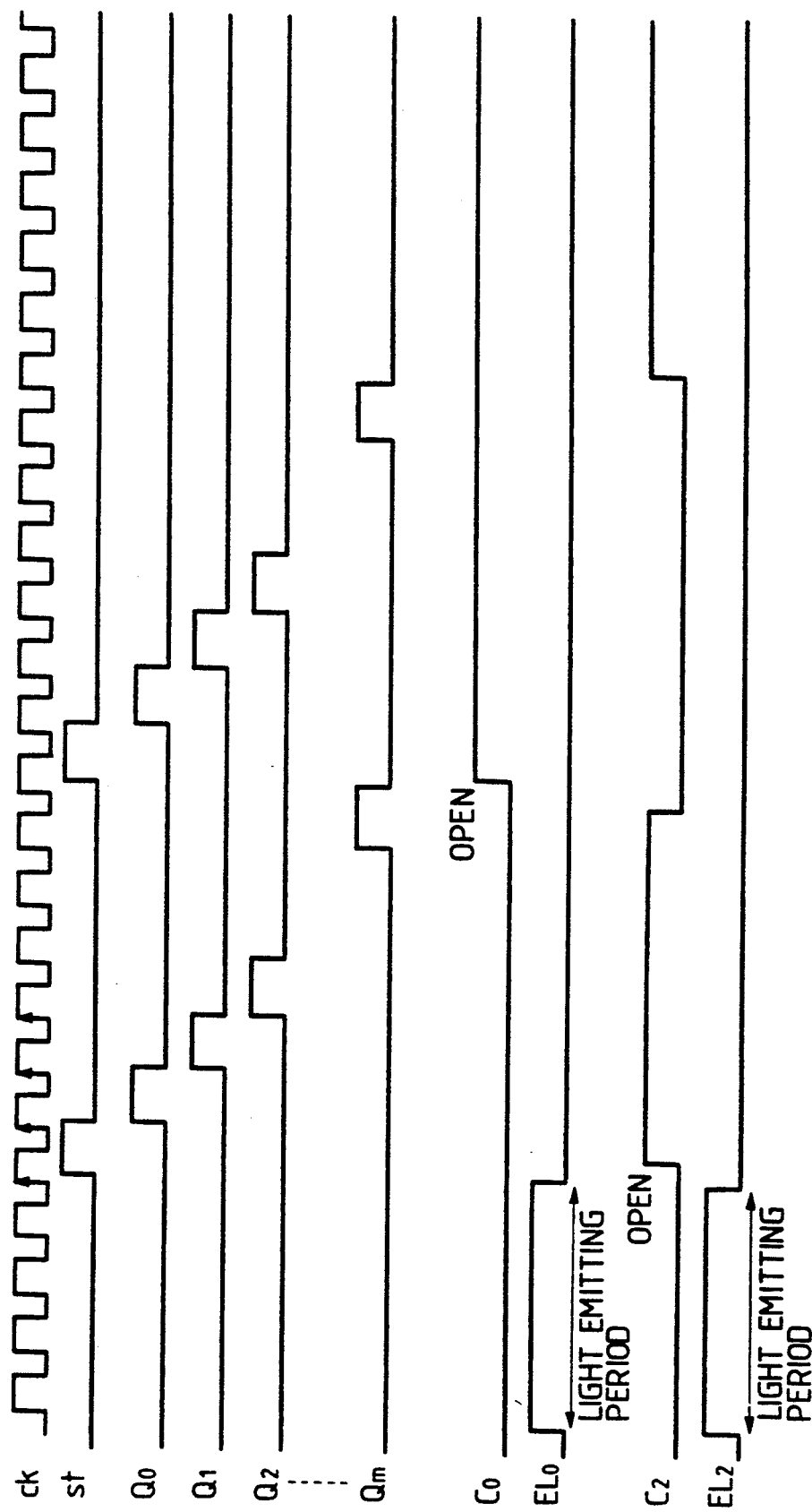
FIG. 31 is a timing chart of another embodiment of a read/display device according to the invention.

In the method of driving the read/display device according to the embodiment shown in FIG. 31, due to the fact that the lines of the light emitting elements of the display device are allowed to emit light every other line, it is possible to greatly reduce the leakage of the light from the adjoining lines into the light receiving elements 22 in the corresponding line of the read device, so that the resolution of the sensor can be improved remarkably. Although the EL elements are allowed to emit light every other line in the method of driving the read/display device shown in FIG. 31, the invention is not limited to this but the EL elements may be allowed to emit light every two or more lines.

Figure 32:
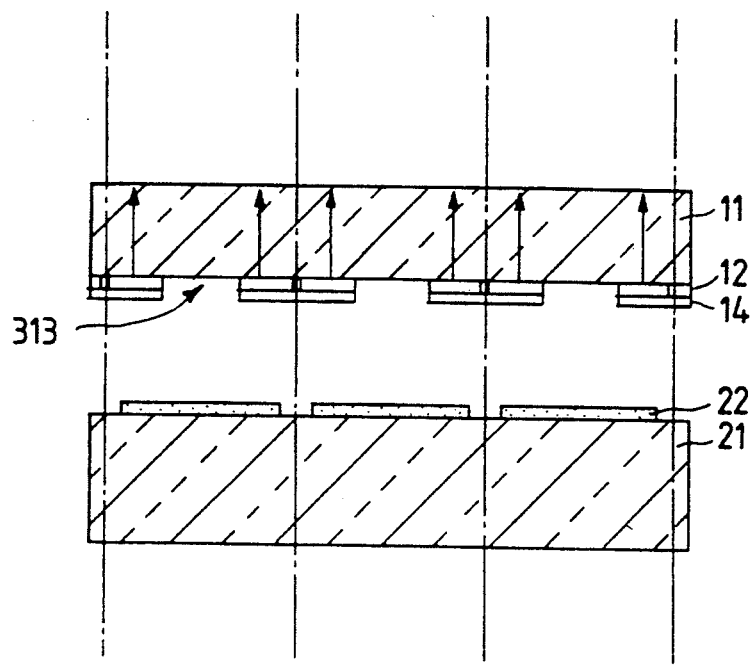
FIG. 32 is an explanatory section view of the above embodiment, showing the display state.

Also, to display on the display device the two-dimensional image data read out by the light receiving elements 22, as shown in FIG. 32 which is an explanatory section view, drivers respectively connected to the display elements 12 in the row and column directions thereof may be used to drive the display elements 12 of the respective bits corresponding to the image data to emit light.

According to the read/display device illustrated in the present embodiment, a light source is incorporated therein and a paper feed mechanism is not required to thereby be able to realize a compact device. For this reason, the compact device makes it possible to realize a portable image read/display device. Also, since the present device does not require manual scanning, characters, figures and the like can be read without generating any distortion therein.

Although there are used the EL elements as the self light emitting elements in the read/display device illustrated in the present embodiment, the invention is not limited to this but LED elements, PDP elements and other similar elements may be used. Also, as the light receiving elements 22, there are used the photodiodes formed of amorphous silicone (a-Si). a-Si is suitable for the two-dimensional structure of the present embodiment, because a uniform film having a large area can be easily formed of a-Si according to a CDV method.

In the read/display device according to the present embodiment, by making the display elements 12 in a multicolored manner, it is possible to realize a color image sensor/color display device. In particular, in the case of the EL elements, if the light emitting material thereof is changed by means of inorganic or organic materials, then RGB color light emission is possible. Also, because the component materials thereof are all transparent, if the component materials are laminated on one another, a color light source can be realized easily. In this case, there may be provided FIFO memories which respectively correspond to the three colors RGB and the outputs from these FIFO memories may be synthesized, so that a color image sensor can be realized.

According to the present invention, there is provided a method of driving a display/read device including a display device having display elements arranged in a two dimensional manner and a read device having light receiving elements arranged in a two dimensional manner, the light receiving elements being respectively disposed so as to be opposed to the display elements. Specifically, in the present method, a plurality of display elements of the display device are allowed to emit light in such a manner that the mutually adjoining display elements do not emit light simultaneously and electrical variations in the light receiving elements corresponding to the light emitted display elements are read. And similar light emission and reading operations are performed on un-emitted light emitting elements and light receiving elements which correspond thereto as well. That is, according to the present method, the mutually adjoining light emitting elements are not allowed to emit light simultaneously to thereby be able to reduce the leakage of light from the adjoining pixels, so that the resolution of the read device can be improved.

Further, there is provided a method of driving a display/read device including a display device having display elements arranged in a two dimensional manner and a read device having light receiving elements arranged in a two dimensional manner, the light receiving elements being respectively disposed so as to be opposed to the display elements. Specifically, in the present method, a plurality of lines of display elements of the display device are allowed to emit light in such a manner that the mutually adjoining lines of display elements do not emit light simultaneously and electrical variations in the light receiving elements corresponding to the light emitted display elements are read. And similar light emission and reading operations are performed on the lines of un-emitted light emitting elements and light receiving elements corresponding thereto as well. That is, according to the present method, mutually adjoining lines of light emitting elements are not allowed to emit light simultaneously to thereby be able to reduce the leakage of light from the adjoining lines of pixels, so that the resolution of the read device can be improved.

What is claimed is:

1. A two-dimensional image read/display device comprising an image read means having a plurality of light receiving elements arranged two-dimensionally and display means having a plurality of light emitting elements arranged two-dimensionally, said image read means and display means being disposed in stacked relation transversely to respective reference planes through said light receiving elements and said light emitting elements, said image read means or said display means having an original document carrying surface, the light emitting elements disposed on the side of the original document carrying surface with a distance from an original document to the light receiving elements equal to Z which equals $ab/(a-c) \leq Z \leq 3ab/(a+c)$, with a pixel pitch expressed as a (dot/nm), another distance from the original document to a light incident window expressed as b($\mu$m), and a size of the light incident window expressed as c($\mu$m), and each of said light receiving elements being disposed at a position so as to receive light generated from each of said light emitting elements and reflected by the original document.

2. The two-dimensional image read/display device as set forth in claim 1 wherein said original document carrying surface is the same as the display surface of said display means and a light shield portion is provided on an image reading side of each of said light emitting elements to prevent direct transmission from said light emitting elements to said light receiving elements.

3. The two-dimensional image read/display device as set forth in claim 2 wherein said light shield portion is formed by an electrode used to drive said light emitting elements.

4. The two-dimensional image read/display device as set forth in claim 1 wherein said original document carrying surface is disposed on an image reading side opposite to the display surface of said display means and a light shield portion is disposed on a display means side of said light receiving elements.

5. The two-dimensional image read/display device as set forth in claim 4 wherein said light shield portion is formed by an electrode used to form said light receiving elements.

6. The two-dimensional image read/display device as set forth in claim 1 wherein said image read means is disposed in general alignment with said display means.

7. The two-dimensional image read/display device as set forth in claim 1 wherein the respective light receiving elements are horizontally displaced from the respective light emitting elements in the respective reference planes to be in vertical nonalignment.

8. The two-dimensional image read/display device as set forth in claim 7 wherein adjoining light receiving elements are disposed at positions corresponding to respective pixel areas, and wherein light is prevented from entering each light receiving element from pixel areas corresponding to adjoining light receiving elements.

9. The two-dimensional image read/display device as set forth in claim 7 wherein means are provided for enabling at least light emitting elements adjoining each of said light receiving elements to emit light simultaneously when reading the image.

10. The two-dimensional image read/display device as set forth in claim 8 wherein means are provided for enabling at least light emitting elements adjoining each of said light receiving elements to emit light simultaneously when reading the image.

11. The two-dimensional image read/display device as set forth in claim 1 wherein each of said light emitting elements comprises at least one light transmission opening and each of said light receiving element is disposed in the upper or lower portion of said light transmission opening.

12. The two-dimensional image read/display device as set forth in claim 1 wherein said display means and image read means are provided on separate substrates and the two separate substrates are bonded to each other.

13. The two-dimensional image read/display device as set forth in claim 12 wherein the substrates of said display means and image read means are disposed in such a manner as to be shifted mutually from each other in vertical and transverse directions thereof, and a drive circuit for said display means and a drive circuit for said image read means are respectively disposed on the two sides of the substrates of said display means and image read means, that are not superimposed on each other.

14. The two-dimensional image read/display device as set forth in claim 1 wherein said display means and image read means are superimposed on each other on a single substrate.

15. The two-dimensional image read/display device as set forth in claim 1 wherein said original document carrying surface is made of resin.

16. A two dimensional image read/display device comprising:
   a substrate;
   an optical sensor means provided on said substrate; and
   a light emitting means provided on said optical sensor means,
   wherein said optical sensor means comprises a sensor area and a non-sensor area arranged alternately in a two dimensional manner, said light emitting means comprises a light emitting area and a light transmissive area arranged alternately in a two dimensional manner, and said sensor area is disposed in opposition to said light transmissive area at a predetermined distance therefrom.

17. A method of driving a two-dimensional image read/display device comprising a read means having light receiving elements arranged in a two dimensional manner and a display means disposed on said read means and having light emitting elements arranged in a two dimensional manner, said light emitting elements being respectively disposed in opposition to said light receiving elements, and said method comprising the steps of: emitting light from said light emitting elements by allowing a plurality of light emitting elements to emit light in such a manner that mutually adjoining light emitting elements of said display means have no simultaneous light emission; and reading electrical variations in said light receiving elements of said read means by reading light from the light receiving elements that are responsive to the light emitting elements that have been allowed to emit light.

18. A method of driving an image read/display device comprising a read means having light receiving elements arranged in a two dimensional manner and a display means disposed on said read means and having light emitting elements arranged in a two dimensional manner, the light emitting elements being respectively disposed in opposition to the light receiving elements, said method comprising the steps of: emitting light from said light emitting elements by allowing a plurality of light emitting elements to emit light in such a manner that mutually adjoining lines of light emitting elements of said display means have simultaneous light emission; and reading electrical variations in the light receiving elements of said read means by reading light from the light receiving elements that are responsive to the light emitting elements that have been allowed to emit light.

* * * * *

UNITED STATES PATENT AND TRADEMARK OFFICE
CERTIFICATE OF CORRECTION

PATENT NO. : 5,313,055
DATED : May 17, 1994
INVENTOR(S) : Yoshiyuki SHIRATSUKI et al.

It is certified that error appears in the above-indentified patent and that said Letters Patent is hereby corrected as shown below:

Claim 1, Column 21, Line 68: "(dot/nm)" should read --(dot/mm)--.

Signed and Sealed this

Third Day of January, 1995

Attest:

BRUCE LEHMAN

Attesting Officer

Commissioner of Patents and Trademarks